(12) United States Patent
Qiu et al.

(10) Patent No.: US 11,137,417 B2
(45) Date of Patent: Oct. 5, 2021

(54) CONTACTLESS TESTING OF ELECTRONIC CIRCUITS

(71) Applicant: Keysight Technologies, Inc., Santa Rosa, CA (US)

(72) Inventors: Tie Qiu, Singapore (SG); Andrew Choon Kait Tek, Singapore (SG); Huang Shaoying, Singapore (SG)

(73) Assignee: Keysight Technologies, Inc., Santa Rosa, CA (US)

( * ) Notice: Subject to any disclaimer, the term of this patent is extended or adjusted under 35 U.S.C. 154(b) by 89 days.

(21) Appl. No.: 16/554,195

(22) Filed: Aug. 28, 2019

(65) Prior Publication Data

US 2020/0348340 A1 Nov. 5, 2020

Related U.S. Application Data

(60) Provisional application No. 62/840,831, filed on Apr. 30, 2019.

(51) Int. Cl.
  *G01R 1/07* (2006.01)
  *G01R 31/70* (2020.01)
  *G01R 31/302* (2006.01)
  *G01R 31/312* (2006.01)

(52) U.S. Cl.
  CPC ............. *G01R 1/07* (2013.01); *G01R 31/302* (2013.01); *G01R 31/312* (2013.01); *G01R 31/70* (2020.01)

(58) Field of Classification Search
  CPC ........ G01R 1/07; G01R 31/70; G01R 31/302; G01R 31/312
  See application file for complete search history.

(56) References Cited

U.S. PATENT DOCUMENTS 6,825,673 B1 * 11/2004 Yamaoka ........... G01R 31/2805
324/537

OTHER PUBLICATIONS

Chinese Notification of Allowance dated Nov. 11, 2020, Application No. 01921731470.X, with English translation, 4 pgs.
Tie Qiu, "A precision near-field split resonator sensor for detection of metallic defects on PCBAs," Journal of Latex Class Files, vol. 14, No. 8, Feb. 2019, pp. 1-5.

* cited by examiner

*Primary Examiner* — Paresh Patel

(57) ABSTRACT

A sensor device is provided for testing electrical connections in a DUT using contactless fault detection. The sensor device includes main traces for conducting an RF signal supplied by a signal source; at least one inductor connected to at least one of the main traces; and a slit formed between opposing conductor portions at a tip of the sensor device for sensing open circuits and/or short circuits in portions of the DUT located in a sensing region below the slit, the tip being at an end of the sensor device opposite ends of the main traces connected to the signal source. An electric field, generated by the sensor device in response to the RF signal, substantially concentrates in the slit, enhancing the sensing of the open and/or the short circuits during the contactless fault detection.

20 Claims, 16 Drawing Sheets

CONTACTLESS TESTING OF ELECTRONIC CIRCUITS

CROSS REFERENCE TO RELATED APPLICATIONS

The present application claims priority under 35 U.S.C. § 119(e) to U.S. Provisional Application No. 62/840,831 naming Tie Qiu, et al. inventors, and filed on Apr. 30, 2019. The entire disclosure of U.S. Provisional Application No. 62/840,831 is hereby specifically incorporated by reference in its entirety.

BACKGROUND

Electronics manufacturers rely on functional testing and in-circuit testing (ICT) of electronic products to provide sufficient test coverage. Functional testing enables fault detection within the electronic products, generally, but does not identify particular components and/or electrical connections within the electronic products when a defective product is identified. This results in numerous failed electronic products being scrapped, to the extent the specific cause of failure cannot be identified, resulting in significant waste and negative environmental impact. ICT enables fault detection, and is able to identify the components (including pins) and/or electrical connections responsible for detected faults. However, depends on availability of test access, e.g., in the form of test pads on a printed circuit board assembly (PCBA) or other electronic circuit being tested. With increasing PCBA density and higher signaling speeds, provisioning of test pads is increasingly difficult.

As a society becomes even more reliant on electronic products, it is important that defective products do not leave the factory, and also that the defective products be repaired when possible with relatively small effort, and not be scrapped. Methodologies have been introduced to attempt to address test needs of devices under test (DUTs), including PCBAs, in limited test access situations. But, these conventional methodologies have constraints, including requiring DUTs to be powered up during testing, complying with a standard, and requiring at least partial test access, for example. Other common limitations include complex data analyses, time-consuming scanning and measurement, high frequency circuitry, low robustness, and insufficient defect sensitivity resolution, and high cost.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
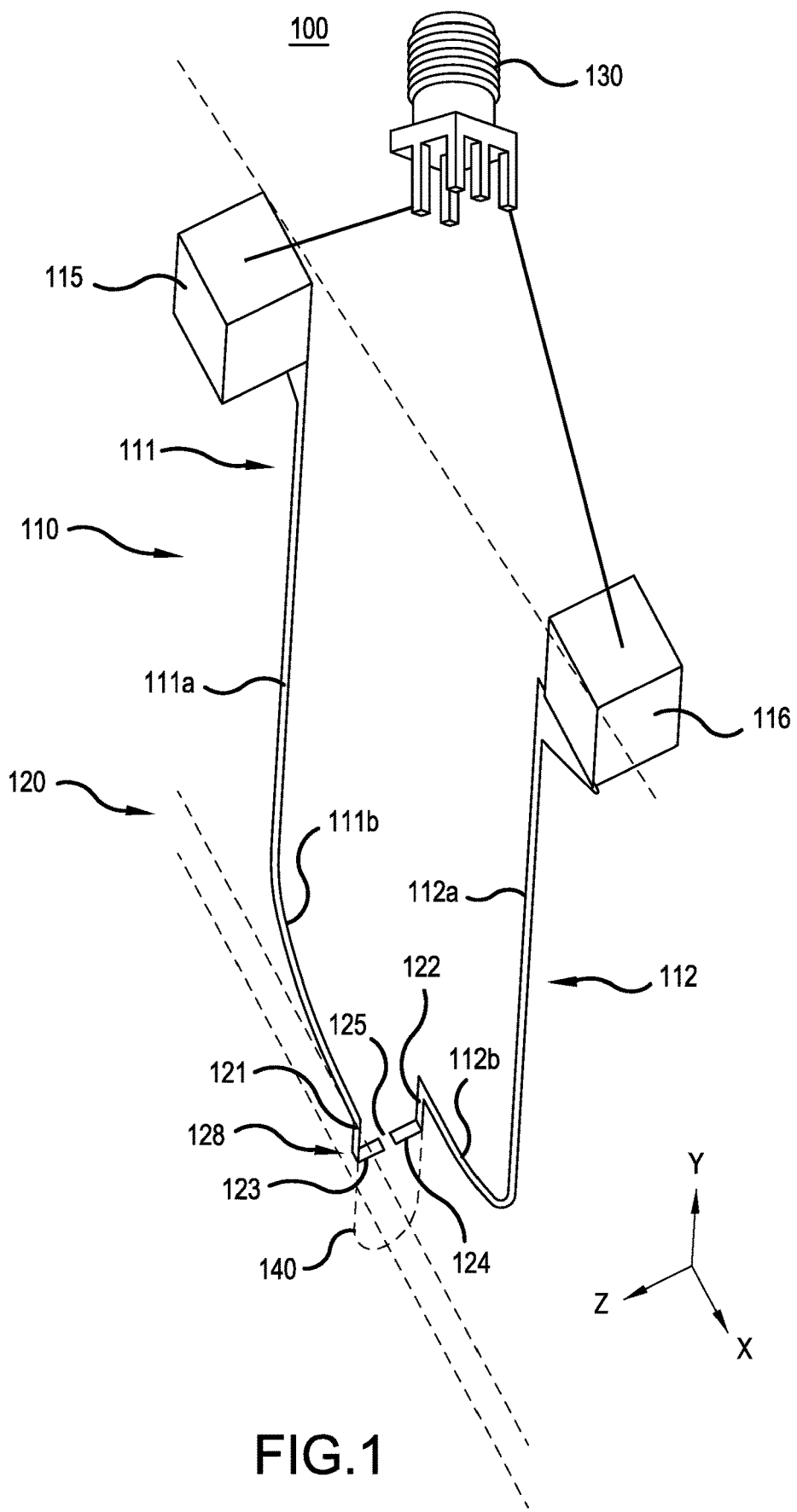
FIG. 1 is a simplified perspective view of a sensor device for testing electrical connections in a device under test (DUT) using contactless fault detection, according to a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

Unless otherwise noted, when a first element is said to be connected to a second element, this encompasses cases where one or more intermediate elements may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," may be used to describe the various elements" relationships to one another, as illustrated in the accompanying drawings. These relative terms are intended to encompass different orientations of the elements thereof in addition to the orientation depicted in the drawings. For example, if an apparatus (e.g., a signal measurement device) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

Generally, according to various embodiments, a sensor device is able to detect open circuit and/or short circuit defects (faults) in an electrical circuit, referred to herein as a device under test (DUT), without physically contacting to the DUT and without being powered during the testing. The DUT may be a printed circuit board (PCB) assembly or an integrated circuit, for example, although the various embodiments may be used to test other types of DUTs having electrical circuitry, without departing from the scope of the present teachings. The various embodiments may be used, for example, to test the integrity of electrically conductive metallic traces on a PCB assembly and/or solder connections at pins of components on a PCB assembly. With regard to solder connections in particular, an open circuit defect may be detected when a solder joint fails to contact a corresponding pin and a short circuit defect may be detected when adjacent solder joints run together electrically connecting the corresponding pins.

Generally, the sensor device may provide two conductors at different potentials, which generate an electric field (E field). The electric field directly affects the value of capacitance induced in the DUT. Whenever there is a disturbance in the electric field, the capacitance changes, and subsequently the resonance frequency of the sensor device. Thus, according to various embodiments, most of the electric field of the sensor device is concentrated in a sensing region at a tip of the sensing device, where fault detection occurs of a portion of the DUT in the sensing region. In order to concentrate the electric field in the sensing region, the sensor device may include, for example, the two main traces that positioned as far apart as possible, within design parameters, and that converge closer to the tip of the sensor device. In addition, an inductance value of the sensor device is fixed, and the inductor(s) are positioned as far as possible, within design parameters, from the tip of the sensor device in order to prevent or minimize coupling of a magnetic field generated around the inductors in the sensing region.

The sensor device according to various embodiments is completely non-contact, so no test pads or other test access is required on the DUT, and enabling faster testing. Also, the sensor device according to various embodiments performs testing without the DUT being powered up, therefore defects may be detected before power is applied to a defective DUT, avoiding potentially damaging the DUT. In addition, there are no special design considerations with regard to standard compliance.

Figure 2:
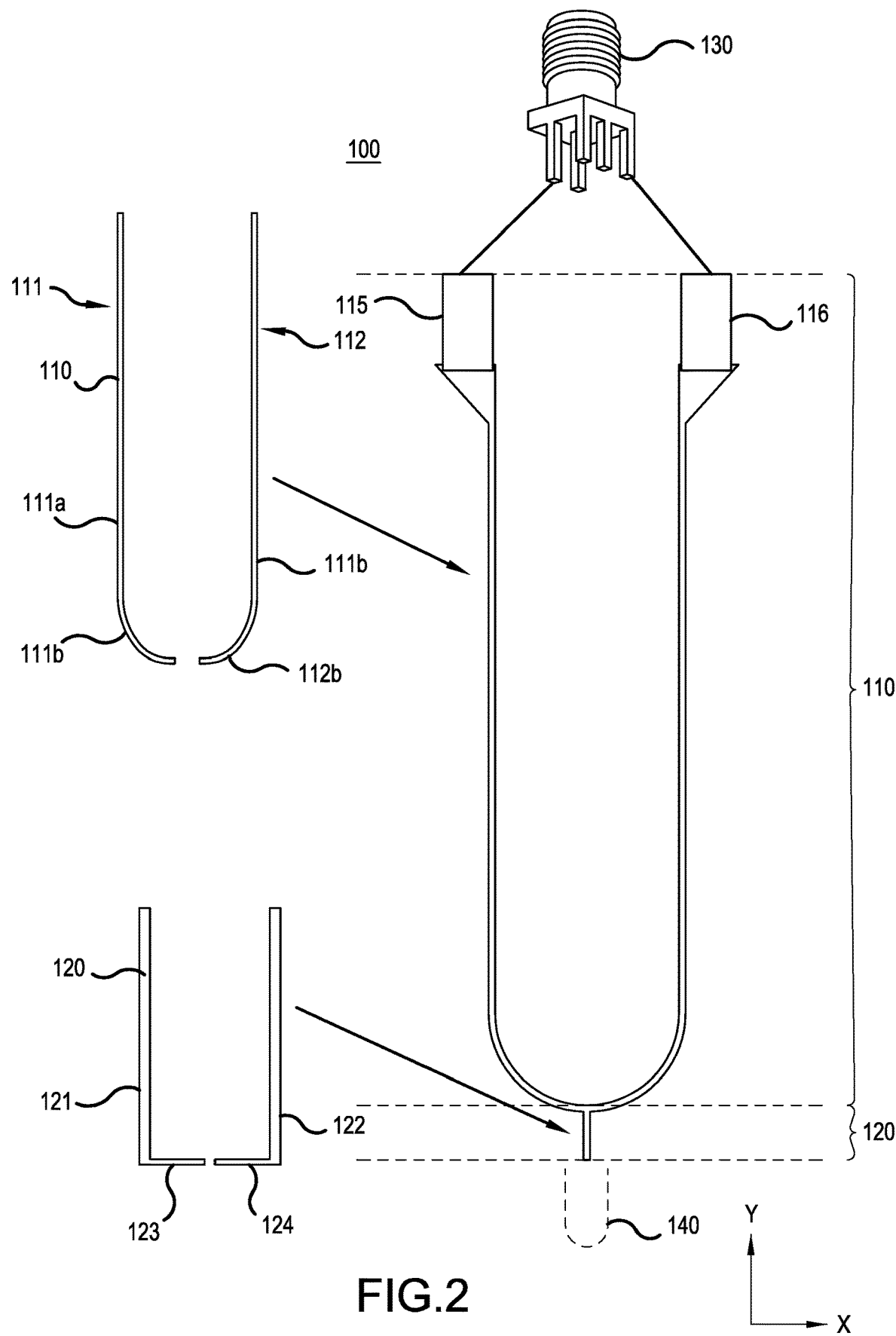
FIG. 2 is a simplified plan view of a sensor device for testing electrical connections in the DUT using contactless fault detection, according to a representative embodiment.

FIG. 1 is a simplified perspective view of a sensor device for testing electrical connections in a DUT using contactless fault detection, and FIG. 2 is a simplified plan view of the sensor device for testing electrical connections in a DUT using contactless fault detection, according to a representative embodiment.

Referring to FIGS. 1 and 2, a sensor device 100 includes a connection circuit 110 and a sensor circuit 120. The connection circuit 110 is connected at a first (upper) end to a connector 130 for connecting to a radio frequency (RF) signal source (not shown) for generating an RF signal to be applied to the sensor device 100 and a receiver for measuring a response by the sensor device 100 to the RF signal. The connector 130 may be a subminiature version A (SMA) connector or a coaxial connector, for example. Also, the RF signal source and the receiver may be included in a vector network analyzer (VNA), for example. However, other types of connectors and/or signal sources (transmitters) and receivers for sending and receiving signals may be incorporated, without departing from the scope of the present teachings. The connection circuit 110 is connected at a second (lower) end to a first (upper) end of the sensor circuit 120.

A tip 128 of the sensor device 100 is at a second (lower) end of the sensor circuit 120, where the tip 128 includes a slit 125 used for sensing open circuits and/or short circuits in portions of a DUT (not shown) located in a sensing region 140 adjacent to (e.g., below) the slit 125. That is, the slit 125 of the sensor device 100 may be moved across the DUT during defect testing, or the DUT may be moved past the slit 125, without coming into physical contact with the DUT, such that different portions of the DUT are exposed to the sensing region 140 to enable the detection of open circuits and/or short circuits. Due in part to the structure for the sensor device 100, an electric field generated by the sensor device 100 in response to the RF signal received from the signal source through the connector 130 is concentrated in the sensing region 140. That is, the sensor device 100 is dependent on the electric field, which is concentrated in the sensing region 140 adjacent to the slit 125.

In the depicted embodiment, the connection circuit 110 includes multiple main traces, indicated by representative first main trace 111 and second main trace 112. Each of the first and second main traces 111 and 112 may be directly or indirectly connected at a first (upper) end to the connector 130 and at a second (lower) end, opposite the first end, to the sensor circuit 120. The first and second main traces 111 and 112 may be formed on or encapsulated in a flexible dielectric material, which may be mounted to a rigid dielectric substrate (not shown) to provide the sensor device 100. The flexible dielectric material may be formed of polyethylene terephthalate (PET), and the rigid dielectric substrate may be formed of FR4, for example, although other flexible and rigid dielectric materials may be incorporated without departing from the scope of the present teachings.

The connection circuit 110 further includes at least one inductor, indicated by representative first inductor 115 and second inductor 116. The first and second inductors 115 and 116 are shown connected at the first ends of the first and second main traces 111 and 112, respectively, such that the first and second main traces 111 and 112 are indirectly connected to the connector 130 via the first and second inductors 115 and 116. Inductor-capacitor (LC) resonance of the sensor device 100 is achieved at a resonance frequency ($f_r$) by the coupling between (i) first and second inductors 115 and 116 and (ii) self-capacitance generated by the sensor device 100, including capacitance of the connection circuit 110, capacitance of the sensor circuit 120 and capacitance induced in the sensing region. The inductance and capacitances of the sensor device 100 are discussed further below.

The first and second inductors 115 and 116 are shown positioned in the sensor device 100 at a maximum distance from the sensor circuit 120. This reduces or prevents coupling of a magnetic field, generated around the first and second inductors 115 and 116, with the sensing region 140 adjacent to the slit 125. The first and second inductors 115 and 116 may be connected to the first and second main traces 111 and 112 elsewhere in the connection circuit 110, without departing from the scope of the present teachings, although generally the further the first and second inductors 115 and 116 are from the tip 128, the better the sensor device 100 performs with regard to defect detection of the electrical device in the sensing region 140 due to the reduction/absence of magnetic field coupling.

Also in the depicted embodiment, the first main trace 111 includes a first straight portion 111a and a first curved portion 111b, and the second main trace 112 includes a second straight portion 112a and a second curved portion 112b. The first and second straight portions 111a and 112a are connected between the connector 130 (e.g., via the first and second inductors 115 and 115, respectively) and the first and second curved portions 111b and 112b, respectively. The first and second curved portions 111b and 112b are connected between the first and second straight portions 111a and 112a, respectively, and the sensor circuit 120. In an illustrative embodiment, the first and second main traces 111 and 112 may have a width of about 0.1 mm and a thickness of about 0.03 mm, for example. Also, the first and second straight portions 111a and 112a may have a length of about 5.0 mm to about 20 mm, and the first and second curved portions 111b and 112b may have a radius of about 0.5 mm to about 2.0 mm, for example. These values are for purposes of illustration, and may vary to provide unique benefits for any particular situation or to meet application specific design requirements of various implementations, without departing from the scope of the present teachings, as would be apparent to one skilled in the art.

In the depicted embodiment, the first and second straight portions 111a and 112a are substantially parallel to one another, and extend along the y-axis (which may be referred to as longitudinal direction for purposes of discussion). In this context, substantially parallel means to be within ±5 degrees of parallel. In alternative embodiments, the first and second straight portions 111a and 112a may not be parallel to one another, without departing from the scope of the present teachings. Also, the first and second straight portions 111a and 112a are offset from one another along the z-axis (which may be referred to as first lateral direction, which is perpendicular to the longitudinal direction, for purposes of discussion) in order to accommodate orientation of the slit 125 at the tip 128 of the sensor device 100, as discussed below. Generally, a magnitude of electric field concentrated in the sensing region 140 is larger the further apart the first and second straight portions 111a and 112a are from one another along the x-axis (which may be referred to as second lateral direction, which is perpendicular to the longitudinal direction, for purposes of discussion).

The sensor circuit 120 is connected to the second end of the connection circuit 110, as discussed above. More particularly, in the depicted embodiment, the sensor circuit 120 includes multiple extensions, indicated by representative first extension 121 and second extension 122 extending from the second ends of the first main trace 111 and the second main trace 112, respectively. The sensor circuit 120 further includes multiple tabs, indicated by representative first tab 123 and second tab 124, extending toward each other from ends of the first extension 121 and the second extension 122, respectively. The first and second extensions 121 and 122 and the first and second tabs 123 and 124 may likewise be formed on or encapsulated in the flexible dielectric material mounted to the rigid dielectric substrate, discussed above.

The first and second tabs 123 and 124 define the slit 125 at the tip 128 of the sensor device 100. The slit 125 is used for sensing defects with a strong electric field concentrated in (and penetrated into) the sensing region 140. More particularly, the slit 125 is configured for sensing open circuits and/or short circuits in portions of the DUT located in the sensing region 140 below the slit 125. That is, the concentration of the electric field in the sensing region 140 enhances the sensing of the open circuits and/or the short circuits during the contactless fault detection.

In the depicted embodiment, the first and second extensions 121 and 122 extend in the longitudinal direction away from the second ends of the first and second main traces 111 and 112, respectively. Also, the first and second extensions 121 and 122 are shown substantially parallel to one another. In this context, substantially parallel means to be within ±5 degrees of parallel. In alternative embodiments, the first and second extensions 121 and 122 may not be parallel to one another, and/or may vary from the longitudinal direction, without departing from the scope of the present teachings. Also, in the depicted embodiment, the first and second tabs 123 and 124 extend from the first and second extensions 121 and 122, respectively, in the first lateral direction. In alternative embodiments, the first and second tabs 123 and 124 may vary from the lateral direction, while still forming the slit 125, without departing from the scope of the present teachings. For example, the first and second tabs 123 and 124 may be angled toward one another, either above or below the lateral direction.

Also, the first and second tabs 123 and 124 may be connected to sides of the first and second extensions 121 and 122, respectfully, as opposed to the bottom edges of the first and second extensions 121 and 122. In this case, the slit 125 formed by the first and second tabs 123 and 124 would face away from the first and second extensions 121 and 122 in a direction perpendicular to the longitudinal direction (in a lateral direction). Or, the first and second tabs 123 and 124 may be connected at an angle to sides (lateral direction) of the first and second extensions 121 and 122, respectfully. The slit 125 formed by the first and second tabs 123 and 124 would therefore face away from the first and second extensions 121 and 122 in a direction corresponding to the angle to the longitudinal direction away from the first and second extensions 121 and 122. In an illustrative embodiment, the first and second extensions 121 and 122 may have a width of about 0.1 mm, a thickness of about 0.03 mm, and a length of about 0.1 mm to about 3.0 mm, for example. Also, the first and second tabs 123 and 124 may have a length of about 0.2 mm to about 0.5 mm, for example. These values are for purposes of illustration, and may vary to provide unique benefits for any particular situation or to meet application specific design requirements of various implementations, without departing from the scope of the present teachings, as would be apparent to one skilled in the art.

As an example, the slit 125 may be formed by physically folding the flexible dielectric material in or on which the traces are formed, and separating or cutting the flexible dielectric material at the fold. For example, FIG. 11 is a perspective view of flexible dielectric material, discussed above, having embedded traces for forming a sensor device, according to a representative embodiment.

Figure 11:
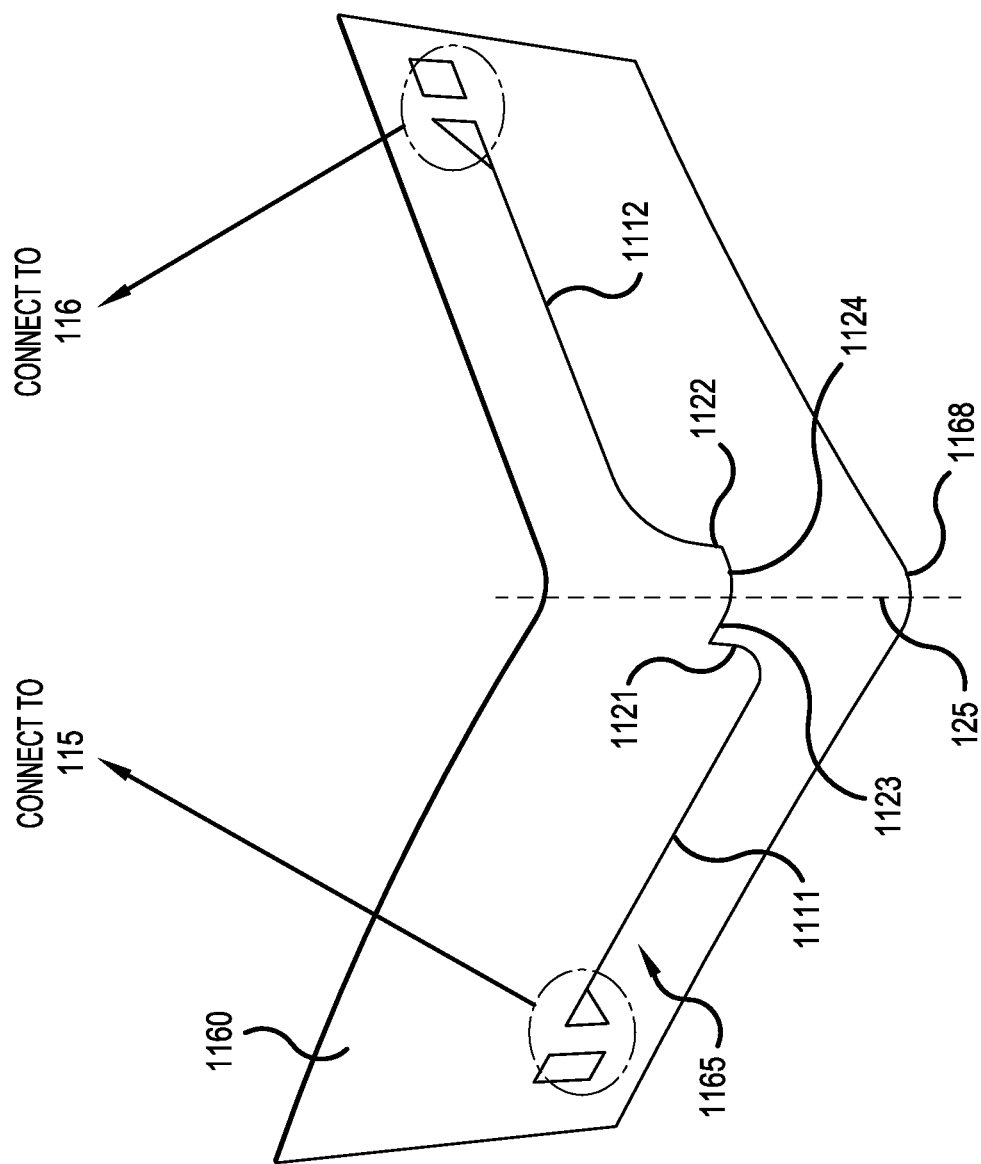
FIG. 11 is a perspective view of flexible dielectric material having embedded traces for forming a sensor device, according to a representative embodiment.

Referring to FIG. 11, flexible dielectric material 1160 includes an embedded trace 1165, which is folded along with the flexible dielectric material 1160 to form fold 1168. The embedded trace 1165 includes first main trace portion 1111, first extension portion 1121 and first tab portion 1123, which correspond to the first main trace 111, the first extension 121 and the first tab 123, respectively, upon separation of the flexible dielectric material 1160 at the fold 1168. Likewise, the embedded trace 1165 includes second main trace portion 1112, second extension portion 1122 and second tab portion 1124, which correspond to the second main trace 112, the second extension 122 and the second tab 124, respectively, upon separation of the flexible dielectric material 1160 at the fold 1168. The slit 125 is formed by the separation at the fold 1168, indicated by a dashed line. Each of the separated portions of the flexible dielectric material 1160 may be attached (e.g., pasted) to rigid dielectric substrate (not shown), as mentioned above, to be held in place for maintaining the slit 125 and the overall shape of the sensing device. First and second inductors 115 and 116 may be mounted to the rigid dielectric substrate and electrically connected to ends of the first and second main traces 111 and 112, opposite the slit 125, as discussed above.

Figure 3:
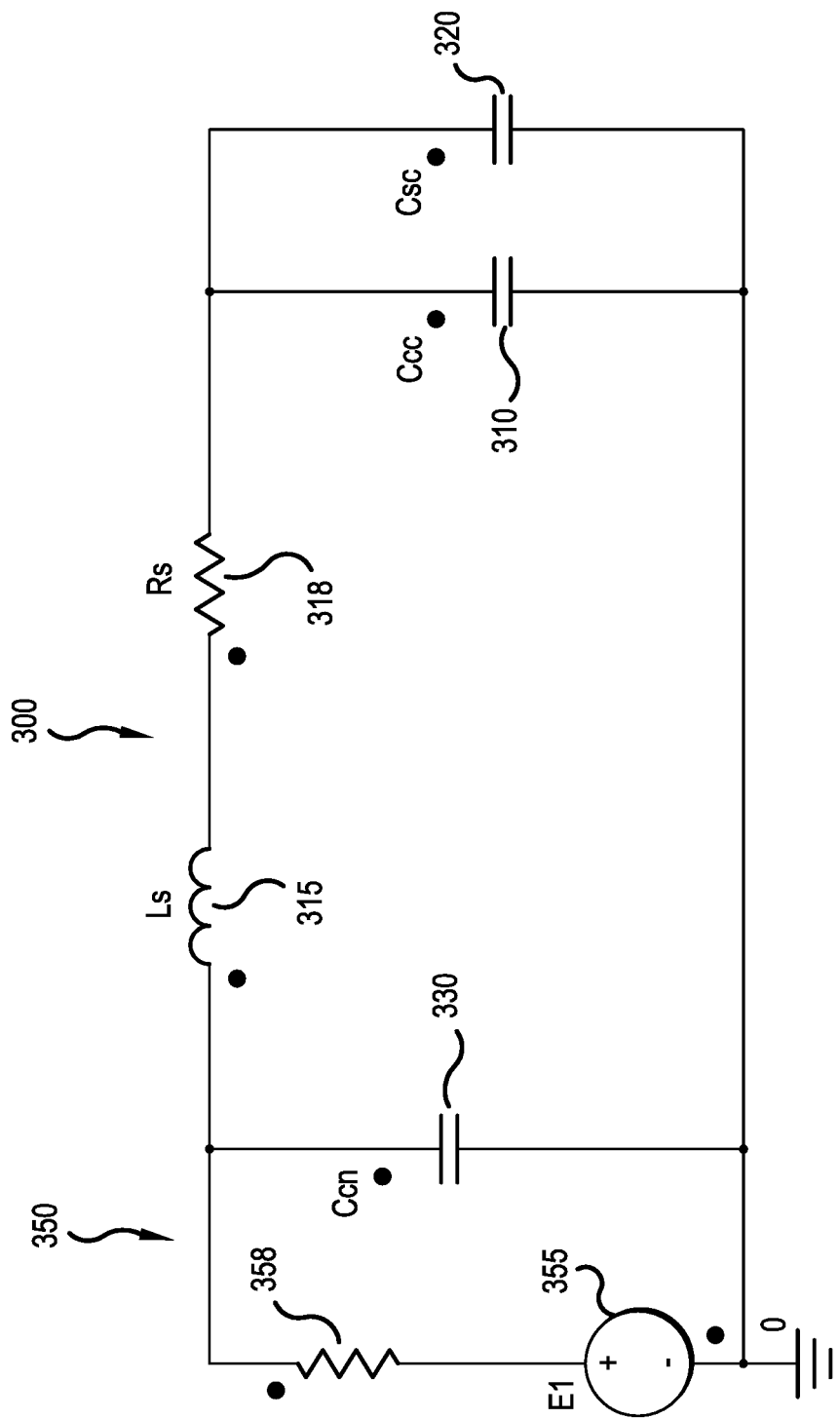
FIG. 3 is a functional circuit diagram corresponding to the sensor device shown in FIGS. 1 and 2 for testing electrical connections in the DUT using contactless fault detection, according to a representative embodiment.

FIG. 3 is a circuit diagram including an equivalent circuit of the sensor device of FIGS. 1 and 2 for testing connections in a DUT using contactless fault detection, according to a representative embodiment.

Referring to FIG. 3, the depicted circuit includes sensor device circuit 300 and signal source circuit 350, where the sensor device circuit 300 corresponds to the sensor device 100 shown in FIGS. 1 and 2. The signal source circuit 350 includes a voltage source 355 connected in series with an output resistance 358. The signal source circuit 350 may be a standalone transmitter, or may be part of test device, such as a VNA, for example, that also includes a receiver for measuring signals received (e.g., reflected) from the sensor device circuit 300. For example, the test device may perform measurements of S-parameter S11 (reflection coefficient) to determine resonance frequency of the sensor device circuit 300, and thus the sensor device 100. That is, the frequency response of S-parameter S11 may be used to measure the resonance frequency. Also, the S11 magnitude shift at certain frequenc(ies) may be used to monitor when a defect is detected. Other types of signal sources and/or receivers for sending and measuring signals may be incorporated, without departing from the scope of the present teachings. The output resistance 358 may be a matching resistance, e.g., equaling 50 ohms, to provide impedance matching between the signal source circuit 350 and the sensor device circuit 300, as discussed below.

The sensor device circuit 300 includes a fixed inductance 315 ($L_s$) and sensor resistance 318 ($R_s$) connected in series with the signal source circuit 350. The fixed inductance 315 indicates the inductance of the first and second inductors 115 and 116 in FIGS. 1 and 2, and also represents total inductance of the sensor device circuit 300. The sensor resistance 318 indicates total resistance of the sensor device circuit 300, including resistance from the first and second inductors 115 and 116, from the first and second main traces 111 and 112, from the first and second extensions 121 and 122, and from the first and second tabs 123 and 124.

The sensor device circuit 300 further includes connector capacitance 330 ($C_{cn}$) in parallel with the signal source circuit 350, where the connector capacitance 330 indicates the capacitance contributed by the connector 130 when connected to the first end of the connection circuit 110. In addition, the sensor device circuit 300 includes connection capacitance 310 ($C_{cc}$) and sensor capacitance 320 ($C_{sc}$), which are connected in parallel to one another following the sensor resistance 318. The connection capacitance 310 indicates the capacitance contributed by the connection circuit 110 and the sensor capacitance 320 indicates the capacitance contributed by the sensor circuit 120. Collectively, the connection capacitance 310 and the sensor capacitance 320, along with capacitance induced in the sensing region 140 by defects in the DUT (discussed below with reference to FIGS. 6A and 6B) represent total capacitance ($C_s$) of the sensor device circuit 300.

As mentioned above, an LC resonance of the sensor device 100 is induced based on the fixed inductance 315 of the at least one inductor, and a combined total capacitance of the connection capacitance 310 of the connection circuit 110, the sensor capacitance 320 of the sensor circuit 120, and capacitance of the slit 125, which varies in response to the presence of electrically conductive material in the DUT that is aligned in the sensing region 140 with the slit 125 during the contactless fault detection, as discussed below. Generally, the sensor device 100 may be modelled as a simple LC resonance circuit, with the resonance frequency $f_r$ given by Equation (1), where $C_s$ is the total capacitance, including the capacitance of the sensor device 100 ($C_{cc}+C_{sc}$) and the capacitance in the sensing region 140 induced by defects in the DUT, and $L_s$ is the total inductance of the sensor device 100:

$$f_r = \frac{1}{2\pi\sqrt{L_s C_s}} \quad (1)$$

Further with regard to sensor device circuit 300, at the resonance frequency ($f_r$), the input impedance ($Z_{in}$) is given by Equation (2):

$$Z_{in} = \frac{R_s}{1 + j\omega R_s C_{cn}} \quad (2)$$

With this simple equation, impedance matching of the sensor device circuit 300 (and thus the sensor device 100) may be achieved by simply adjusting the values of the sensor resistance 318 ($R_s$) and/or the connector capacitance 330 ($C_{cn}$) of the sensor circuit.

Figure 4:
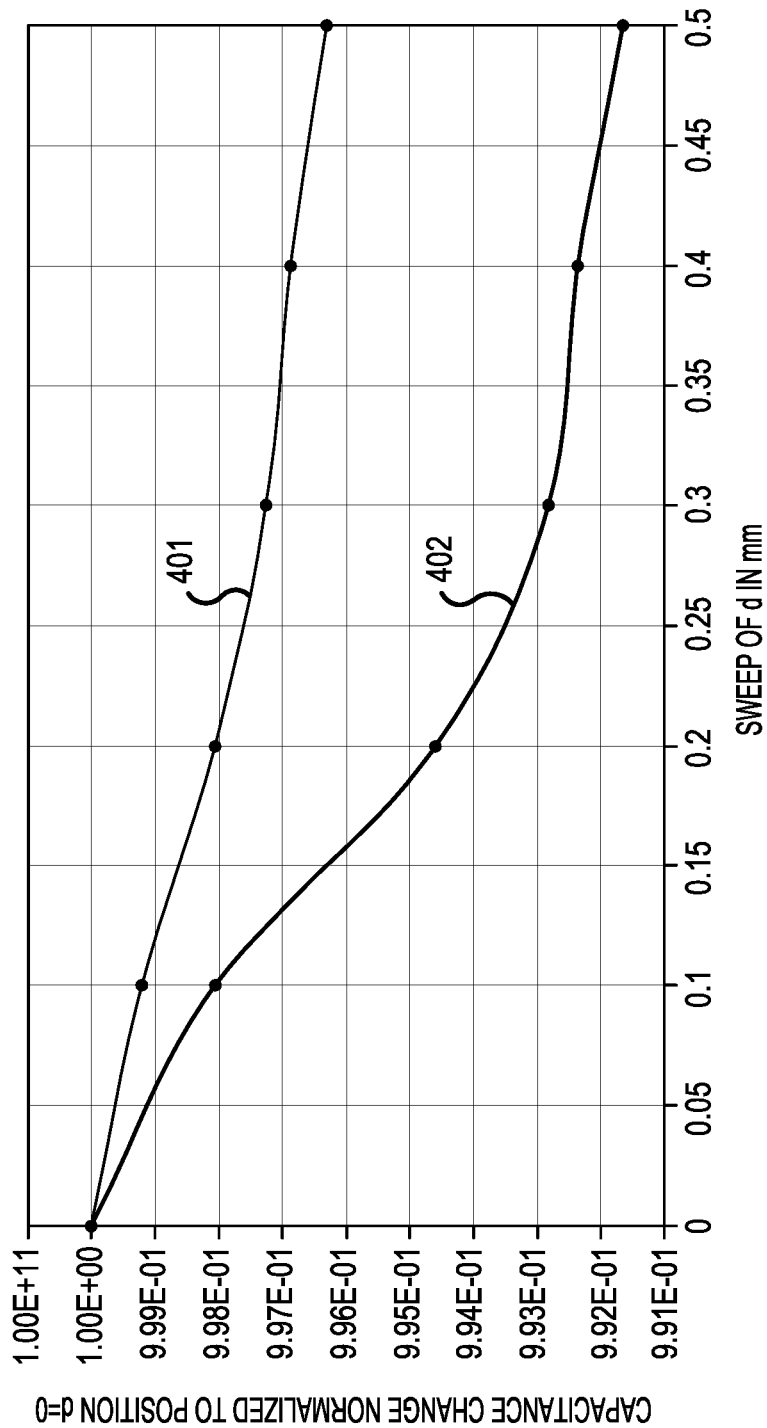
FIG. 4 shows graphs for comparing sensitivities of sensor devices without and with a slit, according to a representative embodiment.

The slit 125 better concentrates (confines) the electric field used for sensing defects of the DUT in the sensing region 140. FIG. 4 shows graphs for comparing sensitivities of sensor devices without a slit and with the slit 125 (defined by the first and second tabs 123 and 124), according to a representative embodiment. To determine the graphs, sweeps of a DUT including a simple metallic structure were made over a distance d along tips of sensor devices, and the responses of capacitance changes of the sensor devices were plotted, normalized to position d=0. In FIG. 4, trace 401 indicates the capacitance changes for a sensor device without the first and second tabs 123 and 124 (thus without the slit 125), and trace 402 indicates the capacitance changes for a sensor device (sensor device 100) with the slit 125 defined by the first and second tabs 123 and 124. Clearly, the addition of the slit 125 results in the sensor device being more sensitive to the movement of DUT with respect to the sensor device, which means the capacitance value of the sensor device drops faster and by a larger amount over the distance d.

Referring again to FIGS. 1 and 2, the first and second extensions 121 and 122 provide extra distance away from the connection circuit 110, where the extra distance removes effects of unsymmetrical electric field that may be generated by the connection circuit 110. That is, portions of the connection circuit 110, such as one or both of the first and second curved portions 111b and 112b, may come in close enough proximity to one or more conductors on the DUT outside the sensing region 140 to generate a spurious capacitance that would reduce the accuracy of the measurement at the slit 125.

The extra distance provided by of each of the first and second extensions 121 and 122 is indicated by length (h). The length (h) may be optimized, since a value of length (h) that is too large will cause waste of the electric field for detecting defects in an extra extension region, while a value of length (h) that is too small may not be sufficient to remove the detrimental effects from the unsymmetrical (and unconcentrated) electric field generated by the connection circuit 110. For example, in order to find an optimized value of the length (h) of the first and second extensions 121 and 122, a metal plate may be placed below the connection circuit 110 (without a sensor circuit 120). The metal plate is moved away from the connection circuit 110 while measuring the capacitance of the connection circuit 110. The capacitance decreases initially and then stabilizes, (almost) no longer changing with the movement of the metal plate. This indicates the distance at which external metal no longer affects the capacitance inherent to the connection circuit 110. Thus, the distance at which the capacitance of the connection circuit 110 stabilizes may be selected as the length (h) of the first and second extensions 121 and 122.

In addition, the width (w) of each of the first and second tabs 123 and 124, as well as the width (s) of the slit 125 defined by the first and second tabs 123 and 124, may be optimized for detecting open defects (e.g., missing material from conductors and/or solder joints in the DUT) and short defects (e.g., additional material between conductors and/or solder joints in the DUT circuit). Optimizing the tab width (w) and the slit width (s) is discussed below with reference to FIGS. 7A-7B and FIGS. 8A-8B.

Figure 5A:
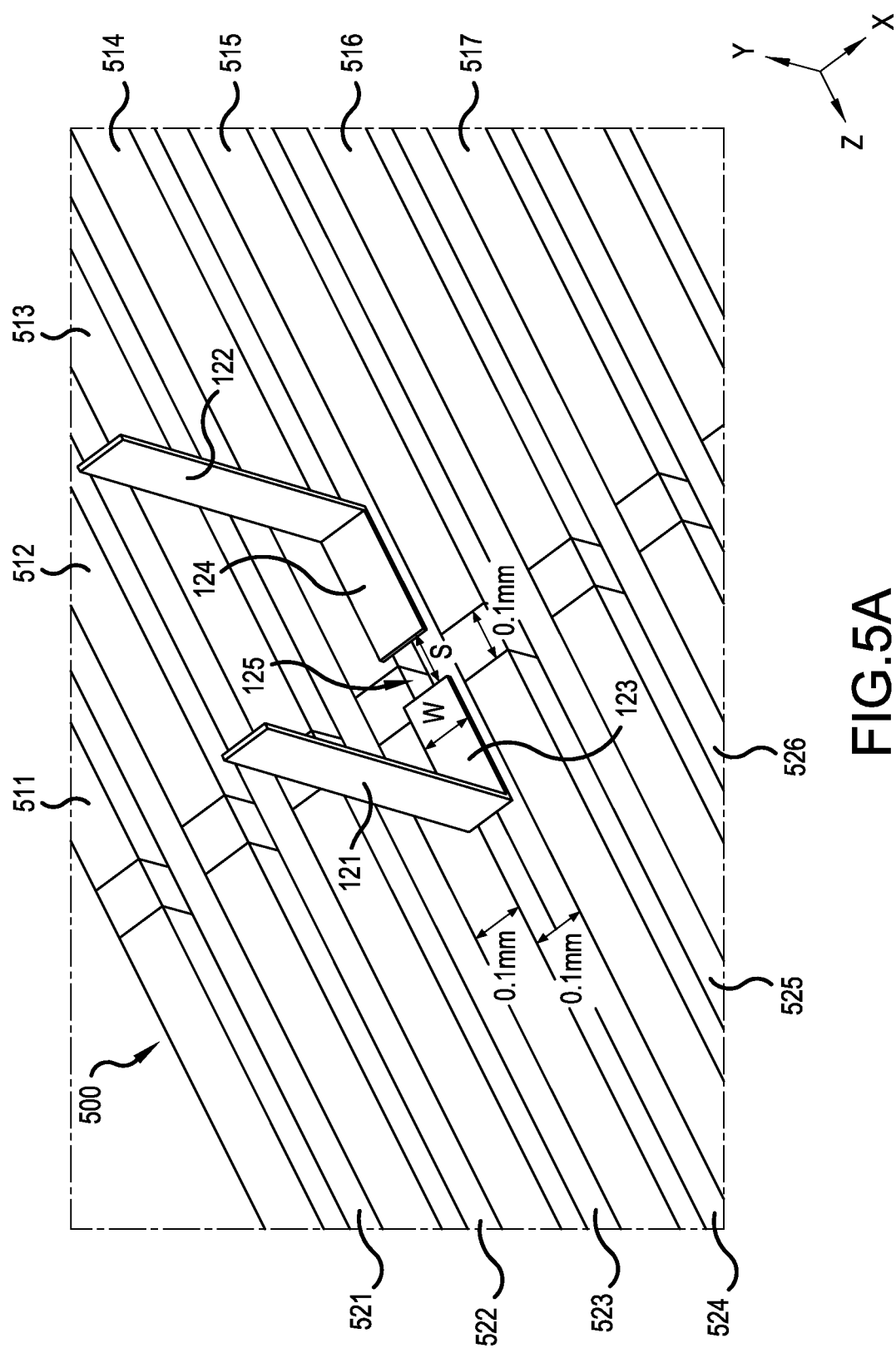
FIG. 5A is a perspective view of an illustrative sensor circuit of a sensor device for performing contactless fault detection in a DUT, according to a representative embodiment.
Figure 5B:
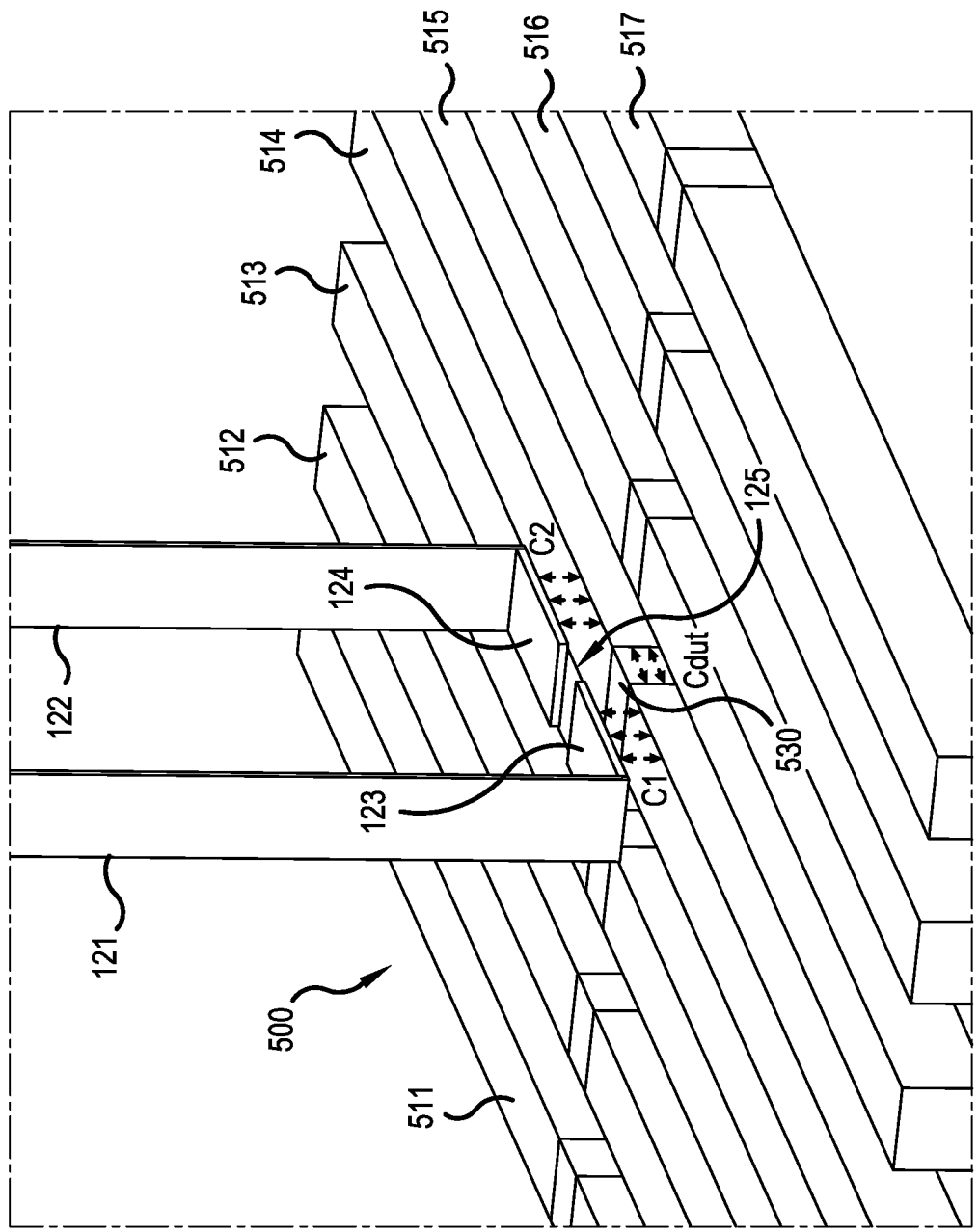
FIG. 5B is a perspective view of the illustrative sensor circuit in FIG. 5A, according to a representative embodiment, where the DUT has an open circuit defect
Figure 5C:
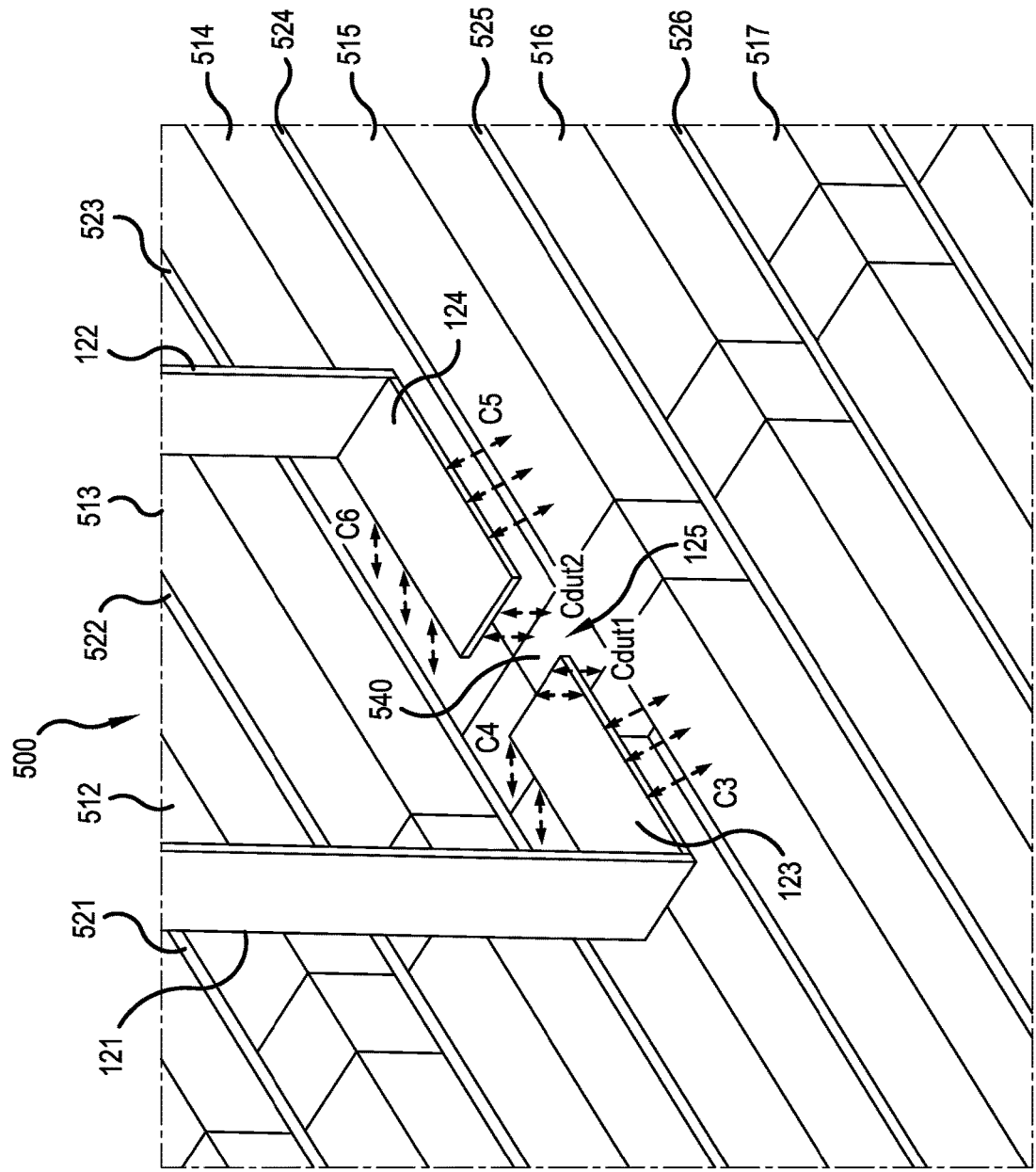
FIG. 5C is a perspective view of the illustrative sensor circuit in FIG. 5A, according to a representative embodiment, where the DUT has a short circuit defect.

FIG. 5A is a perspective view of an illustrative sensor circuit of a sensor device positioned near (but not contacting) a DUT for performing contactless fault detection, according to a representative embodiment. FIGS. 5B and 5C are perspective views of the illustrative sensor circuit positioned near the DUT for performing contactless fault detection, according to a representative embodiment, where FIG. 5B depicts the DUT with an open circuit defect and FIG. 5C depicts the DUT with a short circuit defect. That is, FIGS. 5B and 5C illustrate how the open circuit and short circuit defects appear in the DUT.

Referring to FIG. 5A, the sensor circuit 120 includes first and second extensions 121 and 122 and first and second tabs 123 and 124, as discussed above. The first and second tabs 123 and 124 extend toward one another from the first and second extensions 121 and 122, respectively, to define the slit 125 there between, also as discussed above. Each of the first and second tabs 123 has tab width (w) and the slit 125 has a slit width (s). The DUT 500 includes parallel metallic traces 511, 512, 513, 514, 515, 516 and 517 separated by parallel spaces 521, 522, 523, 524, 525 and 526, respectively, for purposes of illustration. In the depicted example, it may be assumed that each of the metallic traces 511-517 has a width of about 0.1 mm, and that each of the spaces 521-526 also has a width of about 0.1 mm, although it is understood that the various embodiments may be applied to DUTs having different dimensions.

Referring to FIG. 5B, the DUT 500 is shown with an open circuit defect 530, which is effectively an open circuit defect 530 in the metallic trace 514. The open circuit defect 530 may be a gap or other separation in the metallic trace 514 that prevents conduction of electrical current. Positioning the slit 125 of the sensor circuit 120 over the open circuit defect 530, which is in the sensing region 140, enables detection of the same. Referring to FIG. 5C, the DUT 500 is shown with a short circuit defect 540, which may be a spurious deposition of solder or other electrically conductive material in the space 524 that connects the metallic traces 514 and 515, enabling conduction of electrical current. Positioning the slit 125 of the sensor circuit 120 over the short circuit defect 540, which is positioned in the sensing region 140, enables detection of the same.

Figure 6A:
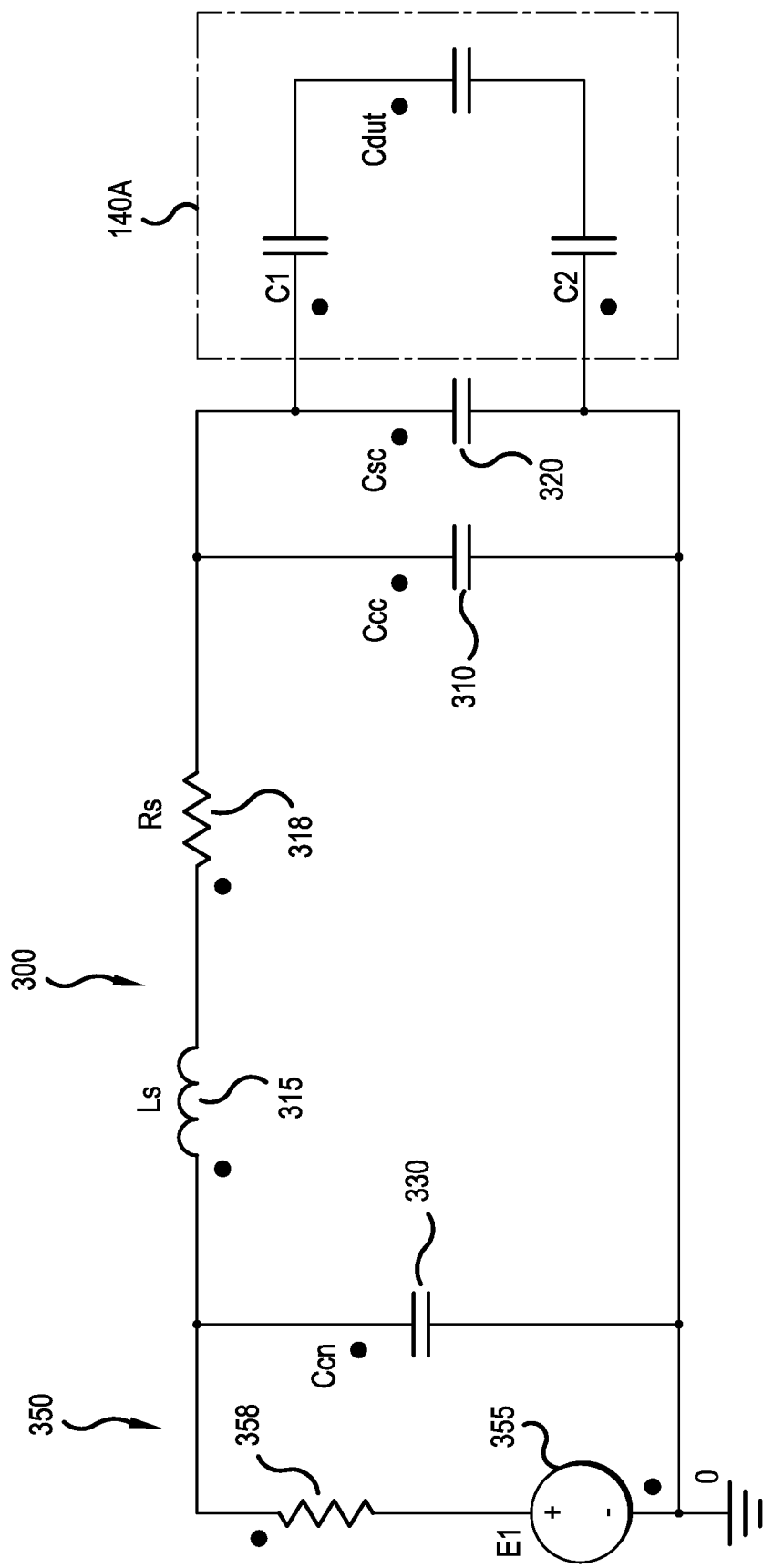
FIG. 6A is a functional circuit diagram corresponding to the sensor device shown in FIGS. 1 and 2 when detecting an open circuit defect in the DUT using contactless fault detection, according to a representative embodiment.

FIG. 6A is a functional circuit diagram corresponding to the sensor device shown in FIGS. 1 and 2 when detecting an open circuit defect in the DUT using contactless fault detection, according to a representative embodiment.

Referring to FIG. 6A, the depicted circuit includes the signal source circuit 350 and the sensor device circuit 300, as discussed above with reference to FIG. 3. The depicted circuit further includes a sensing region circuit 140A that includes capacitances induced in the sensing region 140 in response to the concentrated electric field by the presence of an open circuit defect (e.g., the open circuit defect 530 shown in FIG. 5B). In particular, the sensing region circuit 140A is connected in parallel with the sensor capacitance 320, and includes a first capacitance $C_1$, a DUT capacitance $C_{dut}$ and a second capacitance $C_2$ connected in series with one another. Referring again to FIG. 5B, the first capacitance $C_1$ is a coupling capacitance between the first tab 123 and the metallic trace 514, the second capacitance $C_2$ is coupling capacitance between the second tab 124 and the metallic trace 514, and the DUT capacitance $C_{dut}$ is an additional capacitance induced across the open circuit defect 530 in the metallic trace 514.

As discussed above in regard to Equation (1), the total capacitance $C_s$ of the sensor device 100 includes and the capacitance in the sensing region 140 induced by the open circuit defect in the DUT. That is, the total capacitance $C_s$ is provided by Equation (3):

$$C_s = C_{cc} + C_{sc} + \frac{C_1 C_2 C_{dut}}{C_1 C_{dut} + C_2 C_{dut} + C_1 C_2} \qquad (3)$$

The value of the total capacitance $C_s$ determined from Equation (3) is entered in Equation (1) to determine the resonance frequency $f_r$, which is accordingly influenced by the capacitances induced by the defect (open circuit defect) in the sensing region 140. For example, when an open circuit defect is detected (e.g., DUT capacitance $C_{dut}$ is present), the total capacitance $C_s$ of the sensor device is reduced, and thus the resonance frequency of the sensor device increases.

Figure 6B:
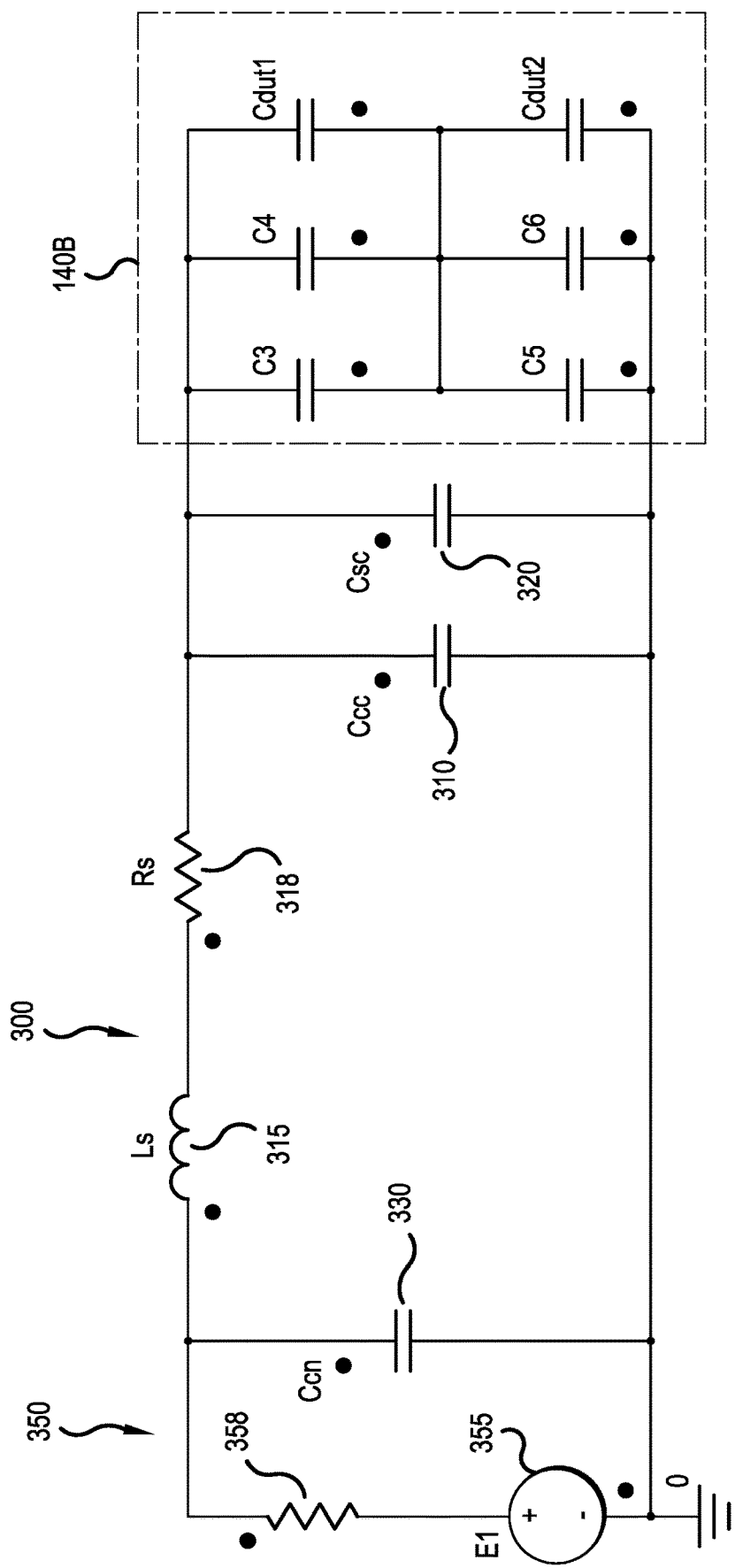
FIG. 6B is a functional circuit diagram corresponding to the sensor device shown in FIGS. 1 and 2 when detecting a short circuit defect in the DUT using contactless fault detection, according to a representative embodiment.

FIG. 6B is a functional circuit diagram corresponding to the sensor device shown in FIGS. 1 and 2 when detecting a short circuit defect in the DUT using contactless fault detection, according to a representative embodiment.

Referring to FIG. 6B, the depicted circuit likewise includes the signal source circuit 350 and the sensor device circuit 300, as discussed above with reference to FIG. 3. The depicted circuit further includes a sensing region circuit 140B that includes capacitances induced in the sensing region 140 in response to the concentrated electric field by the presence of a short circuit defect (e.g., the short circuit defect 540 shown in FIG. 5C). In particular, the sensing region circuit 140B is connected in parallel with the sensor capacitance 320, and includes a third capacitance $C_3$, a fourth capacitance $C_4$ and a first DUT capacitance $C_{dut1}$ connected in parallel with one another, and a fifth capacitance $C_5$, sixth capacitance $C_6$ and a second DUT capacitance $C_{dut2}$ connected in parallel with one another. Referring again to FIG. 5C, the third capacitance $C_3$ is a coupling capacitance between the first tab 123 and the metallic trace 515, the fourth capacitance $C_4$ is a coupling capacitance between the first tab 123 and the metallic trace 514, and the first DUT capacitance $C_{dut1}$ is an additional capacitance induced between the first tab 123 and the short circuit defect 540. Similarly, the fifth capacitance $C_5$ is a coupling capacitance between the second tab 124 and the metallic trace 515, the sixth capacitance $C_6$ is a coupling capacitance between the second tab 124 and the metallic trace 514, and the second DUT capacitance $C_{dut2}$ is an additional capacitance induced between the second tab 124 and the short circuit defect 540.

As discussed above in regard to Equation (1), the total capacitance $C_s$ of the sensor device 100 includes and the capacitance in the sensing region 140 induced by the short circuit defect in the DUT. That is, the total capacitance $C_s$ is provided by Equation (4):

$$C_s = C_{cc} + C_{sc} + \frac{(C_3 + C_4 + C_{dut1})(C_5 + C_6 + C_{dut2})}{C_3 + C_4 + C_{dut1} + C_5 + C_6 + C_{dut2}} \qquad (4)$$

Referring again to FIG. 5A, the tab width (w) of the first and second tabs 123 and 124, and the slit width (s) of the slit 125 may be optimized. During optimization of the tab width (w), it may be assumed that the greater the variation in capacitance value caused by defects (open circuits and/or short circuits) in the DUT 500 as a ratio with a normalized reference condition (without defects), the greater the sensitivity of the sensor device 100. In particular, when detecting an open circuit defect, the lower the ratio, the better the sensitivity of the sensor device 100, e.g., as shown in FIG. 7B discussed below, while for detecting a short circuit defect, the higher the ratio, the better the sensitivity of the sensor device 100, e.g., as shown in FIG. 8B discussed below.

Figure 7A:
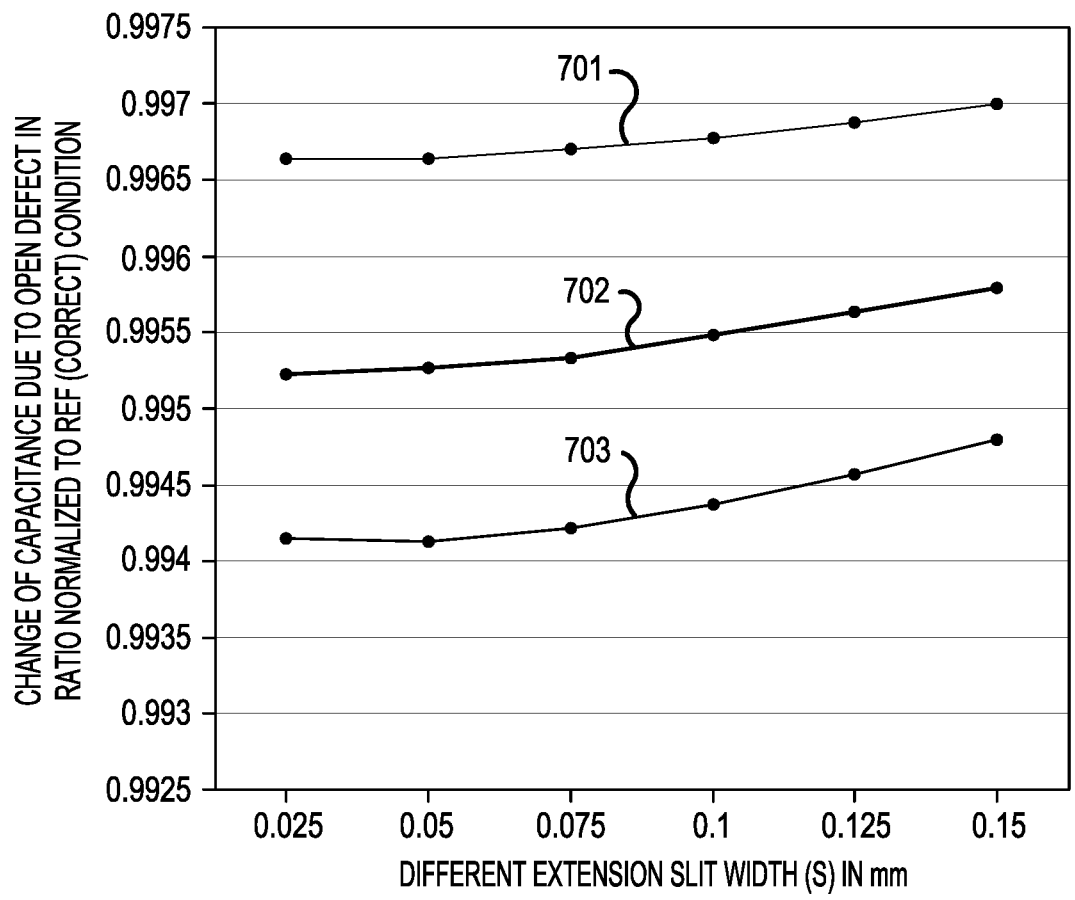
FIGS. 7A and 7B show results of capacitance value variation of a sensor circuit caused by an open circuit defect, according to a representative embodiment, with different slit and extension widths, respectively.
Figure 7B:
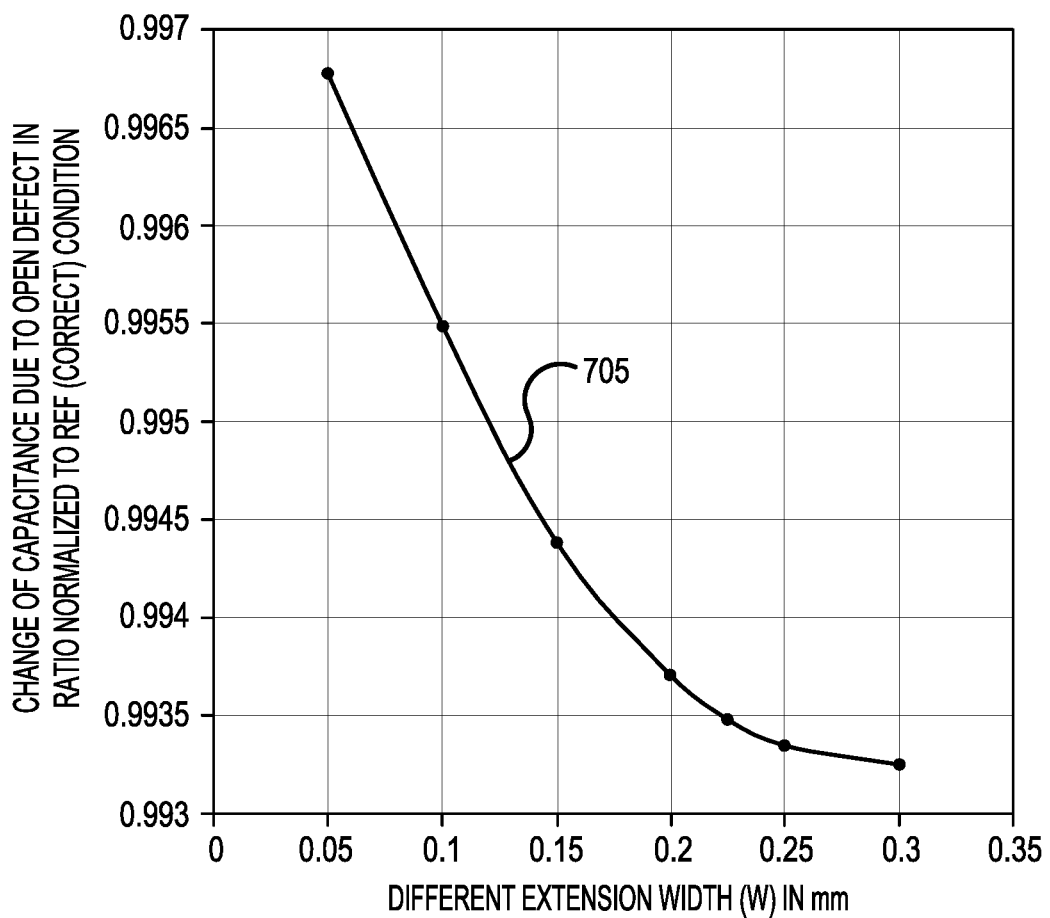
Figure 8A:
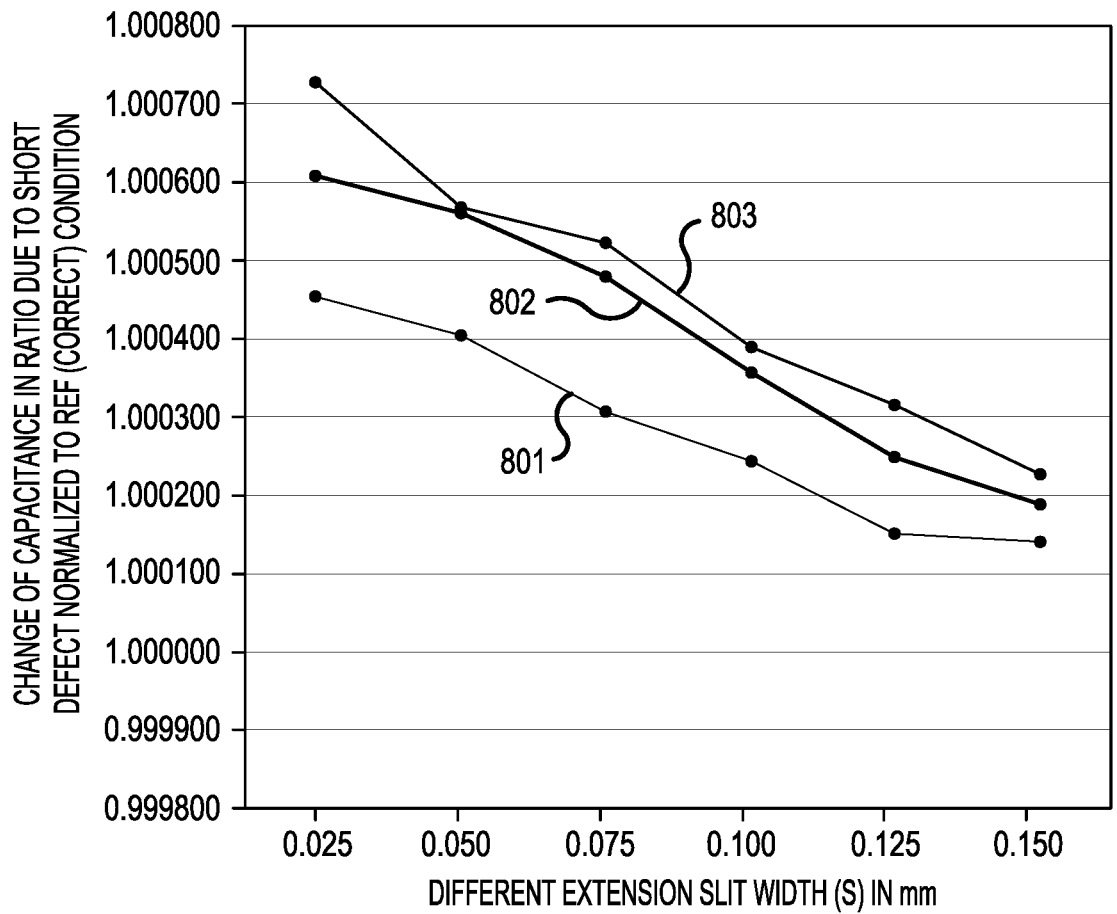
FIGS. 8A and 8B show results of capacitance value variation of a sensor circuit caused by a short circuit defect, according to a representative embodiment, with different slit and extension widths, respectively.
Figure 8B:
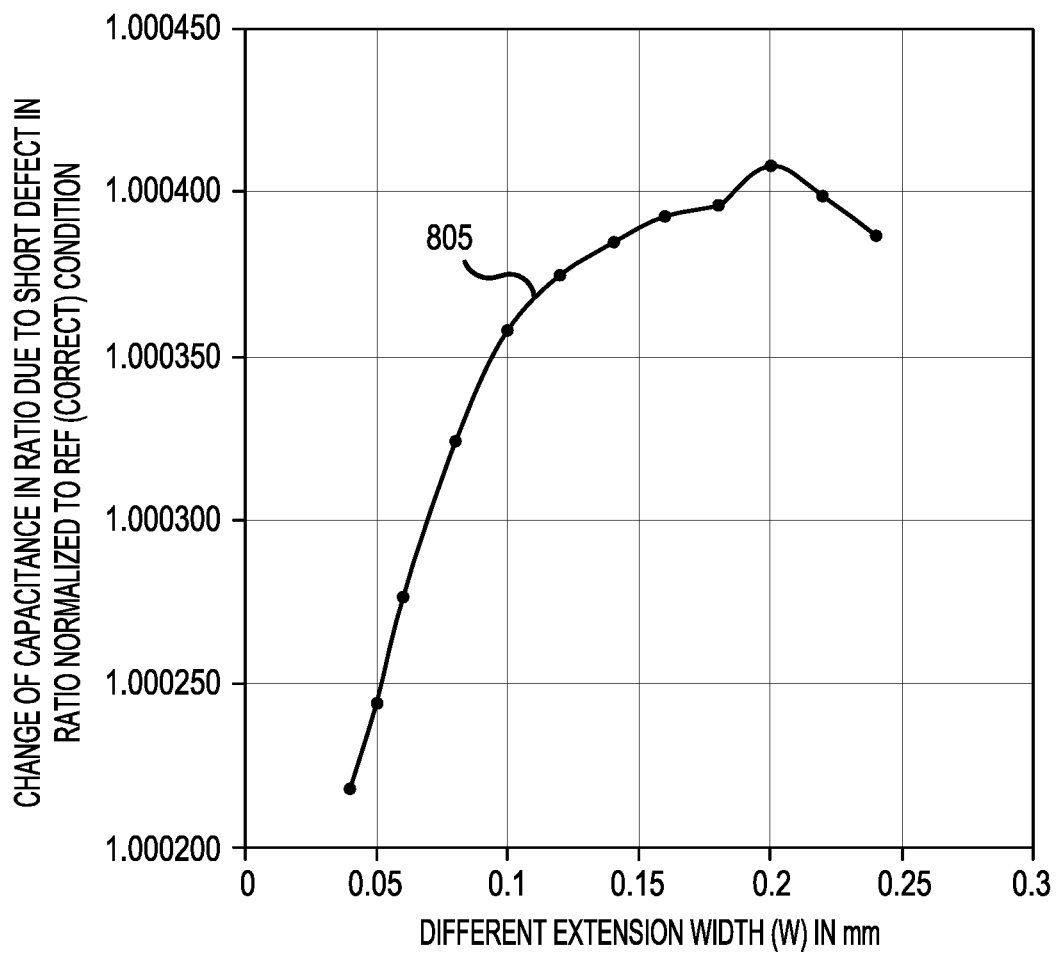

FIGS. 7A and 7B show the results of the total capacitance value variation (including connection capacitance $C_{cc}$ and sensor capacitance $C_{sc}$) of the sensor device caused by an open circuit defect, according to a representative embodiment, with different slit widths (s) and extension widths (w), respectively. FIGS. 8A and 8B show the results of the total capacitance value variation (including connection capacitance $C_{cc}$ and sensor capacitance $C_{sc}$) of the sensor caused by a short circuit defect, according to a representative embodiment, with different slit widths (s) and extension widths (w), respectively.

Referring to FIG. 7A, traces 701, 702 and 703 show capacitance change as a function of different slit widths (s) due to the open circuit defect for different extension widths (w). The vertical axis is change of capacitance due to the open circuit defect in a ratio normalized to a reference condition, and the horizontal axis is different slit widths (s) in mm. Trace 701 corresponds to an extension width of 0.05 mm, trace 702 corresponds to an extension width (w) of 0.10 mm, and trace 703 corresponds to an extension width (w) of 0.15 mm. It may be determined from FIG. 7A that the optimized slit width (s) is about 0.025 mm, where the ratio is smallest as indicated by each of the traces 701, 702 and 703. For purposes of discussion, however, and in light of manufacturing tolerances and costs, a slit width (s) equal to 0.10 mm may be selected.

Referring to FIG. 7B, trace 705 shows capacitance change as a function of different extension widths (w) due to the open circuit defect for the selected slit width (s) of 0.10 mm. It may be determined from FIG. 7B that the optimized extension width (w) should be about 0.3 mm, where the ratio is smallest as indicated by the trace 705.

Similarly, referring to FIG. 8A, traces 801, 802 and 803 show capacitance change as a function of different slit widths (s) due to the short circuit defect for different extension widths (w). The vertical axis is change of capacitance due to the short circuit defect in a ratio normalized to a reference condition, and the horizontal axis is different slit widths (s) in mm. Trace 801 corresponds to an extension width of 0.05 mm, trace 802 corresponds to an extension width (w) of 0.10 mm, and trace 803 corresponds to an extension width (w) of 0.15 mm. It may be determined from FIG. 8A that the optimized slit width (s) should be as small as possible. For purposes of discussion, however, and in light of manufacturing tolerances and costs, a slit width (s) equal to 0.10 mm may be selected.

Referring to FIG. 8B, trace 805 shows capacitance change as a function of different extension widths (w) due to the short circuit defect for the selected slit width (s) of 0.10 mm. It may be determined from FIG. 8B that the optimized extension width (w) is about 0.20 mm, where the ratio is largest as indicated by the trace 805. Overall, it may be determined that the optimized slit width (s) should be about 0.10 mm for open and short circuit defects optimization, considering in part the manufacturing tolerances. However, for the extension width (w), since the short circuit defects have a smaller capacitance change ratio compared to the open circuit defect, the optimized value of 0.20 mm determined for the short circuit defect (FIG. 8B) will be used in the final design of the sensor device 100, as opposed to the value of about 0.30 mm determined for the open circuit defect (FIG. 7B).

In alternative embodiments, the structure of the connection circuit and the sensor circuit of the sensor device may vary, without departing from the scope of the present teachings. A slit for detecting defects in an adjacent sensing region may be formed between main traces of the connection circuit, with or without tabs, so long as sufficient capacitances are induced by defects in the DUT located in the sensing region.

That is, according to various embodiments, the sensor device for testing electrical connections in the DUT using contactless fault detection may include main traces for conducting an RF signal supplied by a signal source, at least one inductor connected to at least one of the main traces, and a slit formed between opposing conductor portions at a tip of the sensor device for sensing open circuits and/or short circuits in portions of the electrical circuit located in the sensing region below the slit. The tip is at an end of the sensor device opposite the respective ends of the main traces that are connected to the signal source (e.g., through an RF connector). An electric field, generated by the sensor device in response to the RF signal, substantially concentrates in the slit, enhancing the sensing of the open circuits and/or the short circuits during the contactless fault detection.

Figure 9A:
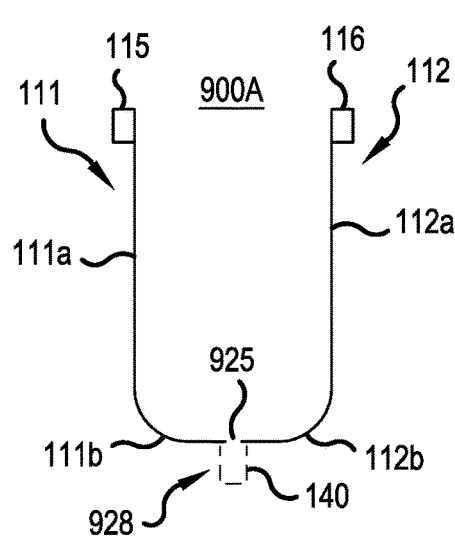
FIG. 9A is a simplified plan view of a sensor device for testing electrical connections in a DUT using contactless fault detection, according to a representative embodiment, in which opposing conductor portions are ends of curved portions of main traces.
Figure 9B:
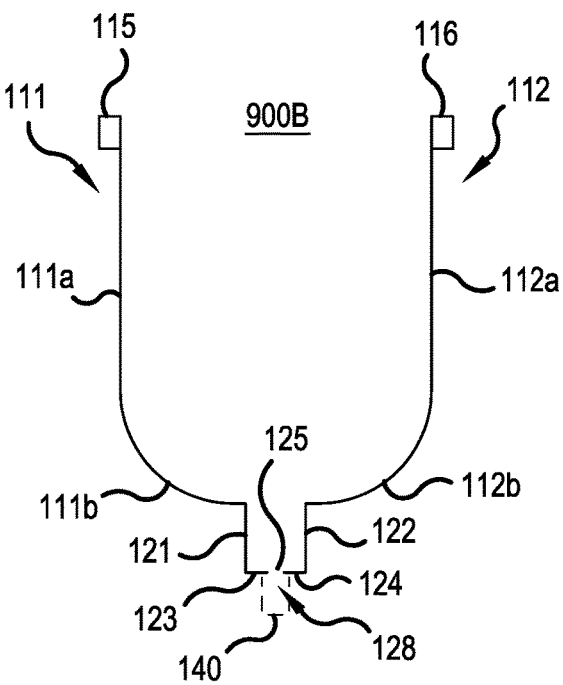
FIG. 9B is a simplified plan view of a sensor device for testing electrical connections in a DUT using contactless fault detection, according to a representative embodiment, in which opposing conductor portions are ends of tabs extending toward one another from extensions connected to main traces.
Figure 9C:
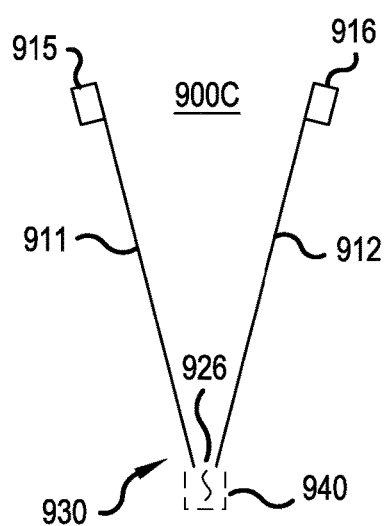
FIG. 9C is a simplified plan view of a sensor device for testing electrical connections in a DUT using contactless fault detection, according to a representative embodiment, in which opposing conductor portions are ends of main traces arranged in a substantially V-shape.

FIGS. 9A, 9B and 9C are simplified plan views of sensor devices for testing electrical connections in a DUT using contactless fault detection, according to representative embodiments, having different connection circuit structures and different slit formations between opposing conductor portions at tip of the sensor devices.

FIG. 9A is a simplified plan view of a sensor device for testing electrical connections in a DUT using contactless fault detection, according to a representative embodiment, in which the opposing conductor portions are ends of curved portions of the main traces.

Referring to FIG. 9A, sensor device 900A is similar to sensor device 100 (without the z-axis offset), and includes first main trace 111 and second main trace 112 connected to a signal source (not shown), and first inductor 115 and second inductor 116 connected to the first and second main traces 111 and 112, respectively. The first main trace 111 has first straight portion 111a and first curved portion 111b, and the second main trace 112 includes second straight portion 112a and second curved portion 112b. A tip 928 of the sensor device 900A is at a second (lower) end of the sensor device 900A, where the tip 928 includes a slit 925 used for sensing open circuits and/or short circuits in portions of a DUT (not shown) located in sensing region 140 adjacent to (e.g., below) the slit 925. The structure of the sensor device 900A concentrates an electric field generated by the sensor device 900A in response to the RF signal in the sensing region 140, as discussed above with reference to the sensing region 140. The sensor device 900A is thus able to detect open circuits and/or short circuits in the DUT.

FIG. 9B is a simplified plan view of a sensor device for testing electrical connections in a DUT using contactless fault detection, according to a representative embodiment, in which the opposing conductor portions are ends of tabs extending toward one another from extensions connected to the main traces. Referring to FIG. 9B, sensor device 900B is substantially the same as the sensor device 100, discussed above, and thus the description will not be repeated here.

FIG. 9C is a simplified plan view of a sensor device for testing electrical connections in a DUT using contactless fault detection, according to a representative embodiment, in which the opposing conductor portions are ends of main traces arranged in a substantially V-shape.

Referring to FIG. 9C, sensor device 900C includes first main trace 911 and second main trace 912 connected to a signal source (not shown), and first inductor 915 and second inductor 916 connected to the first and second main traces 911 and 912, respectively. The first and second inductors 915 and 916 are substantially the same as the first and second inductors 115 and 116, discussed above. A tip 930 of the sensor device 900 corresponds to an apex of the V-shaped arrangement of the first and second main traces 911 and 912 at a second (lower) end of the sensor device 900C. The tip 930 includes a slit 926 used for sensing open circuits and/or short circuits in portions of a DUT (not shown) located in sensing region 940 adjacent to (e.g., below) the slit 926. The slit 926 is defined by the ends of the first and second main traces 911 and 912, respectively. The structure of the sensor device 900C concentrates an electric field generated by the sensor device 900C in response to the RF signal in sensing region 940, as discussed above with reference to the sensing region 140. The sensor device 900C is thus able to detect open circuits and/or short circuits in the DUT. Also, the V-shape of the first and second main traces 911 and 912 provides sufficient distance from metallic traces or conductors in the DUT to avoid inducing spurious capacitances.

Figure 9D:
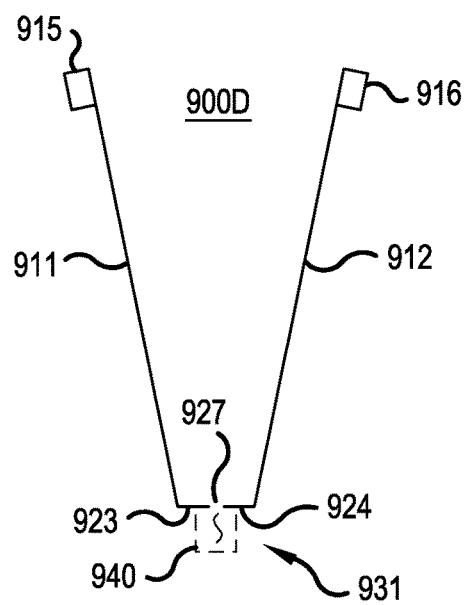
FIG. 9D is a simplified plan view of a sensor device for testing electrical connections in a DUT using contactless fault detection, according to a representative embodiment, in which opposing conductor portions are ends of tabs extending toward one another from ends of main traces arranged in a substantially V-shape.

FIG. 9D is a simplified plan view of a sensor device for testing electrical connections in a DUT using contactless fault detection, according to a representative embodiment, in which the opposing conductor portions are ends of tabs extending toward one another from ends of main traces arranged in a substantially V-shape.

Referring to FIG. 9D, sensor device 900D includes first main trace 911 and second main trace 912 connected to a signal source (not shown), and first inductor 915 and second inductor 916 connected to the first and second main traces 911 and 912, respectively. The sensor device 900D further includes first tab 923 and second tab 924 extending toward one another from the end of the first main trace 911 and the second main trace 912 to form a slit 927 at a tip 931 of the sensor device 900D. The tip 931 corresponds to an apex of the V-shaped arrangement of the first and second main traces 911 and 912 at a second (lower) end of the sensor device 900D. The slit 927 is used for sensing open circuits and/or short circuits in portions of a DUT (not shown) located in sensing region 940 adjacent to (e.g., below) the slit 927. The structure of the sensor device 900D concentrates an electric field generated by the sensor device 900D in response to the RF signal in sensing region 940, as discussed above with reference to the sensing region 140. The sensor device 900D is thus able to detect open circuits and/or short circuits in the DUT. Also, the V-shape of the first and second main traces 911 and 912 provides sufficient distance from metallic traces or conductors in the DUT to avoid inducing spurious capacitances.

Figure 10:
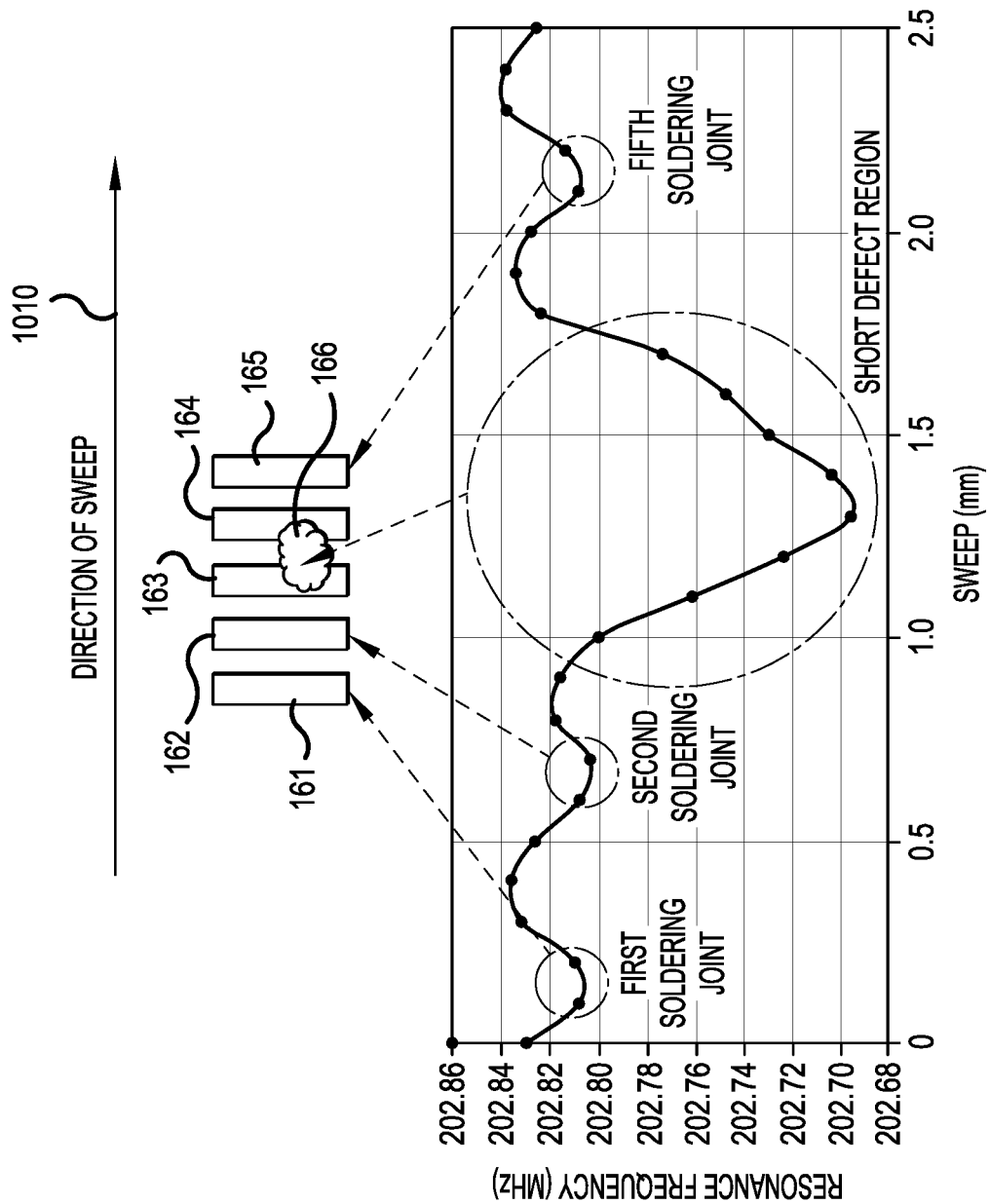
FIG. 10 is a graph showing detection of a short circuit defect in a DUT by a sensor device, according to a representative embodiment.

FIG. 10 is a graph showing detection of a short circuit defect in a DUT by a sensor device, according to a representative embodiment.

Referring to FIG. 10, the graph shows resonance frequency of a sensor device (e.g., sensor device 100 in FIGS. 1 and 2) in MHz as a function of sweeping of the sensor device relative to solder joints of a DUT in mm. In particular, illustrative solder joints include first solder joint 161, second solder joint 162, third solder joint 163, fourth solder joint 164 and fifth solder joint 165, where a short circuit defect 166, e.g., caused by excess solder, is shown electrically connecting the third and fourth solder joints 163 and 164. The distance between adjacent solder joints of the DUT may be about 0.25 mm, and the width of each of the solder joints may be about 0.25 mm, for example. When the sensor device is swept relative to the DUT as shown by arrow 1010, such that the first to fifth solder joints 161 to 165 consecutively pass through the sensing region, the resonance frequency of the sensor device decreases by about 0.01 MHz to about 0.02 MHz for each of the normal solder joints, i.e., the first solder joint 161, the second solder joint 162 and the fifth solder joint 165. However, at the short circuit defect 166 appearing in a gap between the third solder joint 163 and the fourth solder joint 164, the resonance frequency of the sensor device decreases by about 0.12 MHz. Such a substantially larger decrease (e.g., 5 to 15 times larger than the average resonance frequency of a non-defective sweep) in the resonance frequency of the sensor device when positioned between the third solder joint 163 and the fourth solder joint 164 indicates the presence of the short circuit defect 166.

With regard to detecting an open circuit in a DUT by the sensor device, according to a representative embodiment, the resonance frequency of the sensor device substantially increases (e.g., 5 to 15 times larger than the average resonance frequency of a non-defective sweep), as opposed to a large decrease as in the case of short detection. The substantial increase occurs when the sensor device is swept over a solder joint itself that has a break or gap in it (or other type of electrical open).

Generally, the various embodiments enable the sensor device to be positioned very close to (but not contacting) the area under test on an electrical circuit. The sensor device is truly contactless in that it does not have to make any physical contact with the DUT for fault detection. This is the case even for DUTs having minute dimensions. For example, the sensor device according to various embodiments is able to detect defects in a DUT, such as a 0201 IC package surface-mount technology (SMT), which may have conductor or trace widths of 0.3 mm or less, and pitches between conductors or traces of 0.3 mm or less. The sensor device may also detect defects in DUTs with even smaller dimensions, such as DUTs that incorporate bond wires, which may include bond wire pads having pitches of about 35 um to about 80 um, for example. Also the structure enables control of the magnetic field, and formation of the electric field in a sensing region at the tip of the sensor device, to rely predominantly on the electric field for the contactless methodology.

Also, the various embodiments may operate using an RF signal having a frequency in the MHz region, as opposed to a frequency in the GHz region, as in some conventional defect detectors. GHz frequency generation is more expensive than sub-GHz frequency generation. Also, the various embodiments do not require calibration (e.g., to a known element such as water) of the sensor device before start of measurement. In addition, the various embodiments are capable of being integrated into sensing array, which further enhances the measurement speed.

In addition, the sensor device according to various embodiments is an unpowered solution, in that it does not require the DUT to be powered up during fault detection. This is a safer approach to detecting open circuit and/or short circuit defects since powering up the DUT while one or more defects are in place (and uncorrected) may potentially lead to irreversible damage to the DUT.

In various embodiments, the sensor device may be incorporated into an array of sensor devices that may be activated in mass. The use of such an array hyper-accelerates test time, cutting it by 80 to 90 percent, for example.

Also, the sensor device according to various embodiments is cost effective. For example, a prototype of the sensor device described above with reference to FIGS. 1 and 2 uses soft PCB material as the flexible dielectric material, and two inductors, having a cost of less than two dollars per sensor device. With mass production, the cost for the sensor devices (or sensor device arrays) would be further reduced, making them very competitive in the market.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A sensor device for testing electrical connections in a device under test (DUT) using contactless fault detection, the sensor device comprising:
   a plurality of main traces for conducting a radio frequency (RF) signal supplied by a signal source, each of the plurality of main traces having a first end connected to the signal source and a second end opposite the first end;
   at least one inductor connected to at least one main trace of the plurality of main traces at the first end of the at least one main trace; and
   a slit formed between opposing conductor portions at a tip of the sensor device and configured for sensing open circuits and/or short circuits in portions of the DUT located in a sensing region below the slit, the tip being at an end of the sensor device opposite the respective first ends of the plurality of main traces,
   wherein an electric field, generated by the sensor device in response to the RF signal, substantially concentrates in the slit, enhancing the sensing of the open circuits and/or the short circuits during the contactless fault detection.

2. The sensor device of claim 1, wherein an inductance provided by the at least one inductor is fixed.

3. The sensor device of claim 1, wherein a dimension of the slit between the opposing conductor portions is optimized to enable sensing of the open circuits and/or the short circuits in the DUT for traces less than or equal to about 0.3 mm thick and a pitch between traces less than or equal to about 0.3 mm thick.

4. The sensor device of claim 1, wherein the plurality of main traces comprise a first main trace having a first straight portion connected to the signal source and a first curved portion, and a second main trace having a second straight portion connected to the signal source and a second curved portion.

5. The sensor device of claim 4, wherein the opposing conductor portions comprise the second ends of the first and second main traces at the first and second curved portions, respectively.

6. The sensor device of claim 4, further comprising:
a plurality of extensions connected to and extending in a substantially longitudinal direction from the second ends of the first and second main traces, respectively, the plurality of extensions comprising a first extension connected to the first curved portion of the first main trace and a second extension connected to the second curved portion of the second main trace; and
a plurality of tabs comprising a first tab connected to the first extension and a second tab connected to the second extension, the first tab and the second tab extending toward one another from the first extension and the second extension, respectively,
wherein the opposing conductor portions comprise the first and second tabs, respectively.

7. The sensor device of claim 4, wherein the first straight portion is substantially parallel to the second straight portion and separated by a separation distance, and wherein increasing the separation distance between the first straight portion and the second straight portion increases a proportion of capacitance of the slit in a combined capacitance of the sensor device and in the slit.

8. The sensor device of claim 1, wherein the plurality of main traces comprise a first main trace having a first straight portion connected to the signal source and a second main trace having a second straight portion connected to the signal source, wherein the first and second main traces converge from the first ends of the first and second main traces toward the second ends of the first and second main traces to form a substantial V-shape.

9. The sensor device of claim 8, wherein the opposing conductor portions comprise the second ends of the first and second main traces at an apex of the V-shape.

10. The sensor device of claim 8, further comprising:
a plurality of tabs connected to the second ends of the first and second main traces, respectively, the plurality of tabs comprising a first tab connected to the first main trace and a second tab connected to the second main trace, the first tab and the second tab extending toward one another from the first main trace and the second main trace, respectively,
wherein the opposing conductor portions comprise the first and second tabs, respectively.

11. A sensor device for testing electrical connections in device under test (DUT) using contactless fault detection, the sensor device comprising:
a connection circuit connected to a signal source for providing a radio frequency (RF) signal and to a receiver for measuring a reflected signal, the connection circuit comprising:
a first main trace having a first end for receiving the RF signal and a second end opposite the first end;
a second main trace having a first end for receiving the RF signal and a second end opposite the first end; and
at least one inductor connected to at least one of the first main trace and the second main trace; and
a sensor circuit connected to the connection circuit, the sensor circuit comprising:
a first extension connected to and extending away from the second end of the first main trace;
a second extension connected to and extending away from the second end of the second main trace;
a first tab connected to the first extension; and
a second tab connected to the second extension, the first tab and the second tab extending toward one another from the first extension and the second extension, respectively, to form a slit for sensing open circuits and/or short circuits in portions of the DUT located in a sensing region below the slit,
wherein an electric field, generated by the sensor device in response to the RF signal, concentrates in the slit, enhancing the sensing of the open circuits and/or the short circuits during the contactless fault detection.

12. The sensor device of claim 11, wherein an inductor-capacitor (LC) resonance of the sensor device is induced based on a combined fixed inductance of the at least one inductor, and a combined capacitance of the connection circuit, the sensor circuit and the slit, a capacitance of the slit varying in response to presence of electrically conductive material in the DUT that is aligned with the slit during the contactless fault detection.

13. The sensor device of claim 11, wherein the at least one inductor is connected to the at least one of the first and the second main traces at the first end of the at least one of the first and the second main traces, respectively, substantially preventing coupling of a magnetic field generated around the at least one inductor to the sensing region below the slit.

14. The sensor device of claim 11, wherein the first main trace comprises a first straight portion and a first curved portion connected to the sensor circuit, and the second main trace comprises a second straight portion and a second curved portion connected to the sensor circuit.

15. The sensor device of claim 11, wherein the first tab and the second tab are connected to ends of the first extension and the second extension, respectfully, such that the slit formed by the first tab and the second tab faces in a longitudinal direction away from the first and second extensions.

16. The sensor device of claim 11, wherein the first tab and the second tab are connected to sides of the first extension and the second extension, respectfully, such that the slit formed by the first tab and the second tab faces away from the first and second extensions in a direction perpendicular to a longitudinal direction.

17. The sensor device of claim 11, wherein the first tab and the second tab are connected at an angle to sides of the first extension and the second extension, respectfully, such that the slit formed by the first tab and the second tab faces away from the first and second extensions in a direction corresponding to the angle to a longitudinal direction away from the first and second extensions.

18. The sensor device of claim 12, wherein a shift in capacitance of the slit causes a shift in resonance frequency of the sensor device.

19. The sensor device of claim 11, wherein lengths and widths of the first and second extensions are optimized to remove effects of unsymmetrical electric field generated by the connection circuit.

20. A sensor device for testing electrical connections in device under test (DUT) using contactless fault detection, the sensor device comprising:

a connection circuit connected to a signal source for providing a radio frequency (RF) signal and to a receiver for measuring a reflected signal, the connection circuit comprising:
  a first main trace having a first end for receiving the RF signal and a second end opposite the first end;
  a second main trace having a first end for receiving the RF signal and a second end opposite the first end, the first and second main traces converging from the respective first ends toward the respective second ends to form a V-shape; and
  at least one inductor connected to at least one of the first main trace and the second main trace; and
a sensor circuit connected to the connection circuit, the sensor circuit comprising:
  a first tab connected to the second end of the first main trace; and
  a second tab connected to the second end of the second main trace, the first tab and the second tab extending toward one another from the first main trace and the second main trace, respectively, to form a slit for sensing open circuits and/or short circuits in portions of the DUT located in a sensing region below the slit,
wherein an electric field, generated by the sensor device in response to the RF signal, concentrates in the slit, enhancing the sensing of the open circuits and/or the short circuits during the contactless fault detection.

* * * * *